US009580834B2

United States Patent
Najmaei et al.

(10) Patent No.: US 9,580,834 B2
(45) Date of Patent: Feb. 28, 2017

(54) GROWTH METHODS FOR CONTROLLED LARGE-AREA FABRICATION OF HIGH-QUALITY GRAPHENE ANALOGS

(71) Applicants: Sina Najmaei, Houston, TX (US); Zheng Liu, Singapore (SG); Pulickel M. Ajayan, Houston, TX (US); Jun Lou, Houston, TX (US)

(72) Inventors: Sina Najmaei, Houston, TX (US); Zheng Liu, Singapore (SG); Pulickel M. Ajayan, Houston, TX (US); Jun Lou, Houston, TX (US)

(73) Assignee: WILLIAM MARSH RICE UNIVERSITY, Houston, TX (US)

( * ) Notice: Subject to any disclaimer, the term of this patent is extended or adjusted under 35 U.S.C. 154(b) by 382 days.

(21) Appl. No.: 14/203,958

(22) Filed: Mar. 11, 2014

(65) Prior Publication Data

US 2014/0251204 A1    Sep. 11, 2014

Related U.S. Application Data

(60) Provisional application No. 61/776,032, filed on Mar. 11, 2013.

(51) Int. Cl.
| C30B 25/04 | (2006.01) |
| C30B 25/10 | (2006.01) |
| C30B 25/00 | (2006.01) |
| C23C 16/30 | (2006.01) |
| C30B 29/46 | (2006.01) |

(52) U.S. Cl.
CPC ............. *C30B 25/04* (2013.01); *C23C 16/305* (2013.01); *C30B 25/00* (2013.01); *C30B 25/10* (2013.01); *C30B 29/46* (2013.01)

(58) Field of Classification Search
CPC ......... C30B 29/46; C30B 25/00; C23C 16/305
See application file for complete search history.

(56) References Cited

PUBLICATIONS

Zhan, Y., Liu, Z., Najmaei, S., Ajayan, P. M. and Lou, J. (2012), Large-Area Vapor-Phase Growth and Characterization of MoS2 Atomic Layers on a SiO2 Substrate. Small, 8: 966-971. doi:10.1002/smll.201102654.*

(Continued)

*Primary Examiner* — Matthew Song
(74) *Attorney, Agent, or Firm* — Winstead PC

(57) ABSTRACT

In some embodiments, the present disclosure pertains to methods of growing chalcogen-linked metallic films on a surface in a chamber. In some embodiments, the method comprises placing a metal source and a chalcogen source in the chamber, and gradually heating the chamber, where the heating leads to the chemical vapor deposition of the chalcogen source and the metal source onto the surface, and facilitates the growth of the chalcogen-linked metallic film from the chalcogen source and the metal source on the surface. In some embodiments, the chalcogen source comprises sulfur, and the metal source comprises molybdenum trioxide. In some embodiments, the growth of the chalcogen-linked metallic film occurs by formation of nucleation sites on the surface, where the nucleation sites merge to form the chalcogen-linked metallic film. In some embodiments, the formed chalcogen-linked metallic film includes $MoS_2$.

33 Claims, 27 Drawing Sheets

(56) References Cited

PUBLICATIONS

Lee, Y.-H., Zhang, X.-Q., Zhang, W., Chang, M.-T., Lin, C.-T., Chang, K.-D., Yu, Y.-C., Wang, J. T.-W., Chang, C.-S., Li, L.-J. and Lin, T.-W. (2012), Synthesis of Large-Area MoS2 Atomic Layers with Chemical Vapor Deposition. Adv. Mater., 24: 2320-2325. doi:10.1002/adma.201104798.*

Rycerz, A., Tworzydlo, J. & Beenakker, C. W. J. Valley filter and valley valve in graphene. *Nature Physics* 3, 172-175 (2007).

Palacios, T. Graphene electronics: Thinking outside the silicon box. *Nat Nano* 6, 464-465 (2011).

Schwierz, F. Nanoelectronics: Flat transistors get off the ground. *Nat Nanotechnol* 6, 135-136 (2011).

Yin, Z. et al. Single-Layer MoS2 Phototransistors. *ACS Nano* 6, 74-80 (2011).

Ghatak et al., Nature of Electronic States in Atomically Thin MoS2 Field-Effect Transistors. *ACS Nano* 5, 7707-7712 (2011).

Zeng, Z. et al. Single-layer semiconducting nanosheets: high-yield preparation and device fabrication. *Angew Chem Int Ed Engl* 50, 11093-11097 (2011).

Coleman, J. N. et al. Two-dimensional nanosheets produced by liquid exfoliation of layered materials. *Science* 331, 568-571 (2011).

Balendhran et al., Atomically thin layers of MoS2 via a two step thermal evaporation-exfoliation method. *Nanoscale* 2012, 4 (2), 461-466.

Zhan et al., Y., Large-Area Vapor-Phase Growth and Characterization of MoS2 Atomic Layers on a SiO2 Substrate. *Small* 8, 966-971 (2012).

Liu, K. K. et al. Growth of large-area and highly crystalline MoS2 thin layers on insulating substrates. *Nano Lett* 12, 1538-1544 (2012).

Margulis et al. Nested fullerene-like structures. *Nature* 365, 113-114 (1993).

Feldman et al., High-Rate, Gas-Phase Growth of MoS2 Nested Inorganic Fullerenes and Nanotubes. *Science* 267, 222-225 (1995).

Weber et al., Basic Reaction Steps in the Sulfidation of Crystalline MoO3 to MoS2, As Studied by X-ray Photoelectron and Infrared Emission Spectroscopy. *The Journal of Physical Chemistry* 100, 14144-14150 (1996).

Li et al., Formation of MoS2 Inorganic Fullerenes (IFs) by the Reaction of MoO3 Nanobelts and S. *Chemistry—A European Journal* 9, 2726-2731 (2003).

Li et al., Polycrystalline Molybdenum Disulfide (2H—MoS2) Nano- and Microribbons by Electrochemical/Chemical Synthesis. *Nano Letters* 4, 277-281 (2004).

Song, et al. Large-Scale Synthesis of MoS2 Bucky Onions. *Advanced Engineering Materials* 9, 96-98 (2007).

Han et al., Influence of copper morphology in forming nucleation seeds for graphene growth, *Nano Lett* 11, 4144-4148 (2011).

Gao et al., Graphene nucleation on transition metal surface: structure transformation and role of the metal step edge. *J Am Chem Soc* 133, 5009-5015 (2011).

Krivanek et al. Atom-by-atom structural and chemical analysis by annular dark-field electron microscopy. *Nature* 464, 571-574 (2010).

Yazyev et al., Electronic transport in polycrystalline graphene, *Nat Mater* 9, 806-809 (2010).

Huang, P. Y. et al. Grains and grain boundaries in single-layer graphene atomic patchwork quilts. *Nature* 469, 389-392 (2011).

Kim et al. Grain boundary mapping in polycrystalline graphene. *ACS Nano* 5, 2142-2146 (2011).

Yazyev et al., Topological defects in graphene: Dislocations and grain boundaries, *Physical Review B* 81, 195420 (2010).

Liu et al., Dislocations and Grain Boundaries in Two-Dimensional Boron Nitride. *ACS Nano* 6, 7053-7058 (2012).

Shi et al. van der Waals Epitaxy of MoS2 Layers Using Graphene as Growth Templates. *Nano Letters* 12, 2784-2791 (2012).

Zou et al., Predicting Dislocations and Grain Boundaries in Two-Dimensional Metal-Disulfides from the First Principles. *Nano Letters* 13, 253 (2012).

Chhowalla et al., the chemistry of two-dimensional layered transition metal dichalcogenide nanosheets, *Nat Chem* 2013, 5, 263-275.

Xu et al., Graphene-like two-dimensional materials. *Chem. Rev.* 2013, 113, 3766-98.

Huang et al., Metal dichalcogenide nanosheets: preparation, properties and applications. *Chem. Soc. Rev.* 2013, 42, 1934-1946.

Song et al. Large scale growth and characterization of atomic hexagonal boron nitride layers. *Nano Lett.* 2010, 10, 3209-3215.

Dumcenco et al., Visualization and quantification of transition metal atomic mixing in $Mo_{1-x}W_xS_2$ single layers. *Nature Communications* 2013, 4, 1351.

Ci, et al. Atomic layers of hybridized boron nitride and graphene domains. *Nature Materials* 2010, 9, 430-435.

Li, H., et al. Fabrication of single- and multilayer $MoS_2$ film-based field-effect transistors for sensing NO at room temperature. *Small* 2012, 8, 63-67.

Eda et al., Coherent atomic and electronic heterostructures of single-layer $MoS_2$. *ACS Nano* 2012, 6, 7311-7317.

Van der Zande et al. Grains and grain boundaries in highly crystalline monolayer molybdenum disulphide. *Nat. Mater.* 2013, 12, 554-561.

Komsa et al., Two-dimensional transition metal dichalcogenide alloys: stability and electronic properties. *Journal of Physical Chemistry Letters* 2012, 3, 3652-3656.

Bougouma et al., Growth and characterization of large, high quality $MoSe_2$ single crystals. *J. Cryst Growth* 2013, 363, 122-127.

Abdallah et al., Characterization of $MoSe_2$(0001) and ion-sputtered $MoSe_2$ by XPS. *J. Mater. Sci.* 2005, 40, 2679-2681.

Conley et al., Bandgap Engineering of strained monolayer and bilayer $MoS_2$, *Nano Lett.*, 2013, 13 (8), pp. 3626-3630.

Chen et al., Tunable band gap photoluminescence from atomically thin transition-metal dichalcogenide alloys. *ACS Nano* 2013, 7, 4610-4616.

Novoselov, K. S. et al. Electric field effect in atomically thin carbon films. *Science* 306, 666-669 (2004).

Novoselov, K. S. et al. Two-dimensional gas of massless Dirac fermions in graphene. *Nature* 438, 197-200 (2005).

Zhang et al., Experimental observation of the quantum Hall effect and Berrys phase in graphene. *Nature* 438, 201-204 (2005).

Li, X. et al. Large-area synthesis of high-quality and uniform graphene films on copper foils. *Science* 324, 1312-1314 (2009).

Wang, H. et al. Controllable synthesis of submillimeter single-crystal monolayer graphene domains on copper foils by suppressing nucleation. *J Am Chem Soc* 134, 3627-3630 (2012).

Li, X. et al. Large-area graphene single crystals grown by low-pressure chemical vapor deposition of methane on copper. *J Am Chem Soc* 133, 2816-2819 (2011).

Yu, Q. et al. Control and characterization of individual grains and grain boundaries in graphene grown by chemical vapour deposition. *Nat Mater* 10, 443-449 (2011).

Osada, M. & Sasaki, T. 2D Inorganic Nanosheets: Two-Dimensional Dielectric Nanosheets: Novel Nanoelectronics From Nanocrystal Building Blocks. *Advanced Materials* 24, 209-209 (2012).

Radisavljevic, B., Radenovic, A., Brivio, J., Giacometti, V. & Kis, A. Single-layer MoS2 transistors. *Nat Nanotechnol* 6, 147-150 (2011).

Mak et al. Atomically Thin MoS2: A New Direct-Gap Semiconductor. *Physical Review Letters* 105, 136805 (2010).

Splendiani, A. et al. Emerging photoluminescence in monolayer MoS2. *Nano Lett* 10, 1271-1275 (2010).

Mak, K. F., He, K., Shan, J. & Heinz, T. F. Control of valley polarization in monolayer MoS2 by optical helicity. *Nat Nano* 7, 494-498 (2012).

Lin et al., Wafer-scale MoS2 thin layers prepared by MoO3 sulfurization. *Nanoscale* 2012, 4 (20), 6637-6641.

Lee, Y. H. et al. Synthesis of large-area MoS2 atomic layers with chemical vapor deposition. *Adv Mater* 24, 2320-2325 (2012).

Elias et al., Controlled synthesis and transfer of large-area $WS_2$ sheets: from single layer to few layers. *Acs Nano* 2013, 7, 5235-42.

(56) References Cited

OTHER PUBLICATIONS

Najmaei, et al. Vapour phase growth and grain boundary structure of molybdenum disulphide atomic layers. *Nature Materials* 2013, 12, 754-759.
Fang et al. Rapid identification of stacking orientation in isotopically labeled chemical-vapor grown bilayer graphene by Raman spectroscopy. *Nano Lett.* 2013, 13, 1541-1548.
Sundaram et al., Electroluminescence in single layer $MoS_2$. *Nano Lett.* 2013, 13, 1416-1421.
Zhou et al., Intrinsic structural defects in monolayer molybdenum disulfide. *Nano Lett.* 2013, 13, 2615-22.

\* cited by examiner

A

B

C

GROWTH METHODS FOR CONTROLLED LARGE-AREA FABRICATION OF HIGH-QUALITY GRAPHENE ANALOGS

CROSS-REFERENCE TO RELATED APPLICATIONS

This application claims priority to U.S. Provisional Patent Application No. 61/776,032, filed on Mar. 11, 2013. The entirety of the aforementioned application is incorporated herein by reference.

STATEMENT REGARDING FEDERALLY SPONSORED RESEARCH

This invention was made with government support under Grant No. ECCS 0702766, awarded by the National Science Foundation; Grant No. FA8650-07-2-5061, awarded by the U.S. Department of Defense; Grant No. W911NF-11-1-0362, awarded by the U.S. Department of Defense; Grant No. CMMI-0928297, awarded by the National Science Foundation; Grant No. N00014-09-1-1066, awarded by the U.S. Department of Defense; Grant No. DE-FG02-09ER46554, awarded by the U.S. Department of Energy; Grant No. DMR-0820404, awarded by the National Science Foundation; Grant No. DMR-0938330, awarded by the National Science Foundation; Grant No. CNS-0821727, awarded by the National Science Foundation; and Grant No. OCI-0959097, awarded by the National Science Foundation. The government has certain rights in the invention.

BACKGROUND

Current methods of growing high quality graphene analogs have limitations in terms of scalability, control over morphology, efficiency, and quality. Therefore, a need exists for more effective methods of growing graphene analogs. The present disclosure addresses this need.

BACKGROUND

In some embodiments, the present disclosure pertains to methods of growing a chalcogen-linked metallic film on a surface in a chamber. In some embodiments, the method comprises: (1) placing a metal source and a chalcogen source in the chamber; and (2) gradually heating the chamber. In some embodiments, the heating leads to the deposition of the chalcogen source and the metal source onto the surface in the chamber. In some embodiments, the heating also facilitates growth of the chalcogen-linked metallic film from the chalcogen source and the metal source on the surface.

In some embodiments, the surface comprises a pattern. In some embodiments, the growth of the chalcogen-linked metallic film follows the pattern. In some embodiments, the methods of the present disclosure further comprise a step of patterning the surface, such as by photolithography.

In some embodiments, the chalcogen source is selected from the group consisting of oxygen, sulfur, selenium, tellurium, and combinations thereof. In some embodiments, the metal source is selected from the group consisting of metals, metal oxides, transition metals, transition metal oxides, and combinations thereof. In some embodiments, the metal source is selected from the group consisting of molybdenum, tungsten, titanium, and combinations thereof. In some embodiments, the metal source is molybdenum trioxide.

In some embodiments, the chalcogen source and the metal source are deposited onto the surface by chemical vapor deposition. In some embodiments, the growth of the chalcogen-linked metallic film occurs by formation of nucleation sites on the surface, where the nucleation sites merge to form the chalcogen-linked metallic film.

In some embodiments, the methods of the present disclosure further comprise a step of gradually cooling the chamber after gradually heating the chamber. In some embodiments, the chamber is a furnace. In some embodiments, the chamber is under a flow of an inert gas, such as nitrogen.

In some embodiments, the methods of the present disclosure also include a step of controlling a morphology of the chalcogen-linked metallic film by adjusting a growth parameter. In some embodiments, the growth parameter is selected from the group consisting of chalcogen source concentration, chamber pressure, metal source concentration, chamber temperature, type of surface, and combinations thereof.

In some embodiments, the formed chalcogen-linked metallic film comprises a single layer. In some embodiments, the chalcogen-linked metallic film comprises multiple layers. In some embodiments, the chalcogen-linked metallic film is a single-crystalline film. In some embodiments, the chalcogen-linked metallic films include transition metal dichalcogenides. In some embodiments, the chalcogen-linked metallic film is a sulfated metallic film.

In some embodiments, the chalcogen-linked metallic film is selected from the group consisting of $MoS_2$, $MoSe_2$, $MoS_1Se_1$, $WS_2$, $WSe_2$, $TiS_2$, and combinations thereof. In some embodiments, the chalcogen-linked metallic film comprises $MoS_{2(1-x)}Se_{2x}$, where x is at least one of 0.1, 0.3, 0.50 and 0.75. In some embodiments, the methods of the present disclosure also include a step of transferring the formed chalcogen-linked metallic film to a new surface.

DESCRIPTION OF THE FIGURES

FIG. 2A provides a scanning electron microscopy (SEM) image of $MoO_3$ nanoribbons prepared through a standard hydrothermal method and used as precursors in varied densities or condensed films. The scale bar is 4 μm. FIG. 2B provides a depiction of a configuration used in experiments for $MoS_2$ film preparation. FIG. 2C provides a schematic of a chemical vapor deposition (CVD) growth process for $MoS_2$ that highlights the vapor phase reaction between $MoO_{3-x}$ species and sulfur and the deposition of $MoS_2$ on a designated substrate.

FIGS. 3A-D provide SEM images showing the growth process of $MoS_2$ from small triangles to continuous films. The scale bars in FIGS. 3A-D correspond to 2, 20, 10, and 500 μm, respectively. FIG. 3E is an optical image of a large area continuous film synthesized on substrates with rectangular shaped patterns. These patterns are distinguishable by their bright blue color and the areas between them are completely covered by continues $MoS_2$ layers. FIG. 3F shows a close up optical image of the as synthesized $MoS_2$ film on the patterned substrate demonstrating that the method described typically results in single- and bi-layered films between the pillars and thicker samples on the pillars. These patterns act as nucleation promoters. FIG. 3G provides Raman spectra acquired from different regions highlighted in FIG. 3F, showing the thickness and its small variability in the sample. Scale bars in FIGS. 3E-F correspond to 100 and 15 μm, respectively. FIG. 3F is a large area, square centimeter film transferred to a new substrate from a patterned substrate using conventional polymer-based transfer techniques.

FIG. 4A shows that, at low sulfur concentrations (i.e., <0.5 grams), rectangular domains are nucleated. FIG. 4B shows that the Raman signature of these domains correspond to molybdenum oxisulfide ($MoOS_2$). The orthorhombic crystal structure of $MoO_3$ justifies the rectangular shape of these domains. Further sulfurization of the rectangular domains at temperatures of 800-1000° C. reveals a significant solid phase stability of the material. The results are in agreement with hypothesis that the triangular $MoS_2$ domains are nucleated as the vapor phase sulfur reduction of $MoO_3$ is completed on the surface of the substrate. FIG. 4C shows that nucleation of $MoS_2$ begins at sulfur concentrations in the range of 0.5-0.7 grams. However, the domains construct a hexagonal geometry. FIG. 4D shows that, at higher sulfur concentrations (i.e., >0.7 grams), triangular domain nucleation dominates the process.

FIG. 5A shows granular films at 0.5-1 KPa. FIG. 5B shows high density nucleation of triangular domains at 1-4 KPa. FIG. 5C shows formation of large area films at 4-10 KPa. FIG. 5D shows growth of large area triangular domains at 10-40 KPa. FIG. 5E shows formation of isolated triangular domains with modified shapes at 40-80 KPa. FIG. 5F shows star shaped domains at 80-120 KPa.

FIG. 6A provides an SEM image showing the nucleation sites formed across the bare substrate in a random manner, leading to the formation of triangular $MoS_2$. FIG. 6B provides an SEM image demonstrating the affinity of nucleation to the edges and rough surfaces. As evident from this image, a higher density of nucleation is frequently observed on the cross-sectional surface and at substrate edges. FIG. 6C provides induced nucleation of $MoS_2$ domains near artificially-made circular edges on $SiO_2$. Some of the nucleated domains diffuse from these edges to flat surfaces. The scale bars are 1, 10, and 50 μm for FIGS. 6A-C, respectively.

FIG. 8A shows $MoS_2$ synthesis at low densities of $MoO_3$ on 20 μm×20 μm rectangular patterns located 20 μm apart, showing that triangles with sizes ~10 μm have already made II contacts with triangles nucleated from other sites, and suggesting an average grain size in the order of <10 μm for the films made on this type of patterns. FIG. 8B shows that a further supply of $MoO_3$ results in the formation of films with high possibility of over-layer nucleation and over-played growth. FIG. 8C shows $MoS_2$ synthesis using 40 μm×40 μm rectangular patterns located 40 μm apart at low source supply. Triangular domains within the size range of 20 μm are commonly observed. FIG. 8D shows that sufficient source supply allows domains of relatively larger sizes to merge into more continuous and high-crystalline films.

FIGS. 9A-D show that the application of circular patterns demonstrates a commonly observed nucleation and growth process. However, since growth in multiple directions from the initial nucleation sites at the edge of the circles is possible, overlapped and multi-layer growth is more prominent. FIGS. 9E-F show growth using patterns with long rectangular bar where the nucleation is clearly affiliated to these bars. However, smaller surface area results in less surface nucleation, and therefore results in slower formation of the films. An incomplete and scattered formation of ~100 μm films results from the diffusion-limited nature of the synthetic process. The scale bars in all images are 40 μm.

FIG. 10A shows an atomic force microscopy (AFM) image from a $MoS_2$ triangular flake. Nucleation sites at the center of the $MoS_2$ triangle are also visible. The inset is a line scan demonstrating the thickness of a single layered $MoS_2$ flake. FIG. 10B shows a bright field transmission electron microscopy (TEM) image of the $MoS_2$ triangular flakes. The inset shows a selected area electron diffraction (SAED) pattern acquired from this triangle, demonstrating that it is a single crystal with hexagonal structure. FIG. 10C shows a high resolution transmission electron microscopy (HRTEM) image of the edge of a $MoS_2$ triangle showing an estimated thickness of 0.6 nm, corresponding to single layered $MoS_2$. FIG. 10D shows an scanning transmission electron microscopy (STEM-ADF) image representing the defect free hexagonal structure of the triangular $MoS_2$ flake. The brighter atoms are Mo and the lighter ones are S2 columns. The inset shows the fast fourier transform (FFT) pattern of the image, confirming the hexagonal $MoS_2$ structure.

FIG. 11A is an optical image of $MoS_2$ films with optical contrast resembling single layered samples. The scale bar is 40 μm. FIG. 11B shows Raman measurements from the two points marked on FIG. 11A by red and black filled circles demonstrating the thickness variations in these samples. FIGS. 11C-D show the in-plane $E_{12g}$ and out-of-plane $A_{1g}$ modes of vibration positioned at 385 and 405 $cm^{-1}$, respectively, corresponding to single-layered $MoS_2$. These maps demonstrate the thickness consistency in these triangles. It is also evident that these triangles consist of nucleation centers made of $MoS_2$ particles with larger thickness. Grain boundaries are not clearly detected based on the Raman measurements.

FIGS. 12A-B show XPS measurements revealing the complete formation of $MoS_2$ at every stage of the growth process (i.e., from the nucleation of small triangles to continuous films). FIG. 12C shows the EELS spectrum acquired from the defect-free $MoS_2$ monolayer film, showing the S L-edge and Mo M-edge.

FIG. 13A shows BF TEM image of the $MoS_2$ film. FIG. 13B shows DF TEM image of the same region showing a large $MoS_2$ grain across the whole film.

The DF image shown in FIG. 13B was obtained by stitching 74 different DF images, acquired with a spacing of 3 µm under the same microscope conditions. FIG. 13C is an individual DF image acquired from the square area shown in FIG. 13B.

FIG. 14A shows DF TEM image acquired from the continuous $MoS_2$ film using the same diffraction spot (collaged from ~159 individual DF images). Most of the 15×15 um imaging area is covered by grains with the same crystal orientation, demonstrating the large single-crystal grain size of the $MoS_2$ film. FIG. 14B shows BF TEM image of the $MoS_2$ atomic layer containing a junction of three different grains. FIG. 14C is an SAED pattern acquired from the highlighted area in FIG. 14B, showing three sets of six-fold symmetry diffraction patterns with relative rotations of ~5° and 30°. FIG. 14D is a false-color dark field TEM image using the three diffraction spots marked in FIG. 14C showing the presence of three grains.

FIG. 15A shows STEM-ADF image of a grain boundary with 21° tilt angle with common dislocations in $MoS_2$ highlighted. FIGS. 15B-C show magnified views of the regions highlighted by the light blue and red rectangles in FIG. 15A, respectively. Schematic of the dislocation core structures are overlaid in the images, where purple circles are Mo and yellow ones are $S_2$ columns. FIG. 15D shows structure models for a predominant form of dislocations observed in $MoS_2$ grain boundaries. FIG. 15E shows structure models for the Mo-oriented 5|7 dislocation core, experimentally confirmed and highlighted by the light blue rectangle in FIG. 15A. The numbers label different Mo sites that can be substituted by S atoms. FIG. 15F shows structure model for the Mo-oriented 5|7 dislocation core with $S_2$ substitution at the middle Mo site, experimentally confirmed and highlighted by the red circles in FIG. 15A. The yellow, orange and purple spheres represent top and bottom S and Mo, respectively. FIG. 15G shows false-color dark field TEM image showing the presence of two grains with 30° rotation. The white solid line marks the grain boundaries between the two grains, while the yellow dash line marks the overlapped grain junction. FIG. 15H shows STEM-ADF image of an overlapped junction between two grains. The inset shows an FFT of the image showing two sets of $MoS_2$ diffraction sports with 17° rotation. FIG. 15I shows false-colored FFT-filtered image of FIG. 15H showing the distribution of the two grains in cyan and yellow. Overlapping of the two grains at the junction generated the distinct Moiré fringes at the center of the image.

FIG. 16A shows tradition grain boundary formations by chemical bonds between the two in-plane grains at the boundaries. The growth process can further extend through the nucleation of a new layer with crystal orientation similar or different from one of the original in-plane grains. FIG. 16B shows overlapped grain junction formation as a mode of boundary formation, in which no chemical bonds between the two in-plane grains form and the two grains may grow on top of each other. This mode can be distinguished from the traditional grain boundaries in FIG. 16A through high-resolution electron microscopy imaging, where a discontinuity in the lattice structure of conventional grain boundaries is noticeable (see FIG. 15).

FIG. 17A is a negative-16 contrast STEM-ADF image of a $MoS_2$ grain boundary. FIG. 17B is a false-color image of FIG. 17A, with Mo atoms highlighted. Burgers vectors are shown as black arrows, and are calculated by drawing Burgers circuits (shown as red and green lines) and by recording the vectors that would complete the circuits. Following the same notation for Burgers vector in graphene with hexagonal lattice, all dislocations have the shortest Burgers vector (1, 0) with the smallest energy, and with a magnitude proportional to its squared Burgers vector. The results suggest that dislocations can be constructed by inserting or removing a semi-infinite stripe of atoms along the armchair direction in the Mo-oriented lattice.

FIG. 18A is a low-pass filtered ADF image. FIG. 18B is an FFT of the image showing two sets of $MoS_2$ diffraction spots with 17° rotation. FIG. 18C is an FFT-filtered image using one set of diffraction spots highlighted in cyan in FIG. 18B. FIG. 18D is an FFT-filtered image using one set of diffraction spots highlighted in yellow in FIG. 18B. Note that there is no discontinuity in the lattice structure within each grain at the junction point, confirming that the two layers continue to grow on top of each other without forming in-plane chemical bonds. FIG. 18E is a false-color FFT-filtered image constructed from FIGS. 18C-D. FIG. 18F is a magnified view of the highlighted region in FIG. 18E, showing the distinct Moiré fringes generated from the overlapping of the two grains.

FIG. 19A shows a low-pass filtered image. FIG. 19B shows an image after low-pass filtering and partial filtering of the direct diffraction spot in the FFT, which aims to remove the contrast variation due to surface contamination. The light blue circles highlight the positions of Mo-oriented 5|7 dislocation cores at the grain boundary, and the orange circles highlight Mo-oriented 5|7 dislocation cores with an $S_2$ substitution.

FIG. 20A shows FET array devices prepared using a lithography process. FIG. 20B shows phototransistors for photocurrent characterization. At a laser wavelength of 405 nm, the photocurrent response of the $MoS_2$ films is measured for single-layered flakes (FIG. 20C) and few-layered samples (FIG. 20D). For single-layered flakes, an ON/OFF current ratio of ~10 is demonstrated. For few-layered samples, this ratio was measured to be ~3. These results reveal a significant enhancement in the ON/OFF current ratio for the single-layered devices. FIG. 20E shows wavelength dependency of the photocurrent in single-layered samples, which reveals the broad absorption band in this material. The onset of the photocurrent at ~700 nm, as indicated by the dotted line, is associated to the bandgap energy of single-layered samples ~1.8 eV.

FIG. 22A shows room-temperature characteristics of the FET devices with 5 V applied bias voltage. The inset shows drain current-voltage curves acquired for back gating voltages of −60, 0, 40 and 100 V, representing a good ohmic contact. FIG. 22B is a summary of the mobility and ON/OFF ratio measurements on $MoS_2$ FET devices, demonstrating a mobility range of 0.2-18 $cm^2V^{-1}$ $s^{-1}$ and a maximum ON/OFF current ratio of $6 \times 10^6$. FIG. 22C shows the optical image of the $MoS_2$ film showing the presence of a second $MoS_2$ layer grown along the grain boundaries, indicated by the white arrows. FIG. 22D shows a DF TEM image showing the grain boundary covered by a second layer, indicated by the arrow. FIG. 22E-F shows the SEM and optical image of the device designed for the channel length dependency measurements. FIG. 22G shows corresponding Raman mapping of the same locations showing the distributions of the grain boundaries in the film, indicated by the dashed line. FIGS. 22H-I show channel length dependency of the charge carrier mobility and on-off ratio of the FET devices.

FIG. 23A shows a low magnification ADF image showing the formation of second layer along the grain boundary (highlighted). FIG. 23B is an atomic resolution ADF image showing the grain boundary covered by a second layer. FIG. 23C is a fourier filtered image of FIG. 23B showing the position of one grain in the first layer. FIG. 23D is a Fourier filtered image of FIG. 23B showing the position of the other grain in the first layer and the second layer with the same orientation. The grain boundary is highlighted by the yellow dashed lines.

FIG. 24A provides a scheme for the controlled synthesis of $MoS_{2(1-x)}Se_{2x}$ layers via CVD with S/Se powder positioned in the low temperature zone as the source of chalcogens and $MoO_3$ located at the center of the tube as the Mo source. FIGS. 24B-D show typical optical images of monolayer and single-crystal domains, merged domains, and continuous $MoS_{2(1-x)}Se_{2x}$ (x=0.1) films, respectively. Additional layers are found at triangle centers (FIG. 24B) and at the interface between merged triangles (FIG. 24D). FIG. 24E shows AFM height topography of a $MoS_{2(1-x)}Se_{2x}$ (x=0.1) monolayer single-crystal triangle. FIGS. 24F-G show height and phase topographies of the edges in triangular domains. The inset in FIG. 24F is the height profile showing the thickness of ~0.7 nm, measured along the white line.

FIGS. 25A-C shows XPS spectra of S 2p, Se 3d and Mo 3d core levels in the monolayer $MoS_{2(1-x)}Se_{2x}$ with different Se concentrations (x=0.1, 0.3, 0.50 and 0.75). FIG. 25D shows PL spectra of pristine $MoS_2$ (black), $MoS_{1.4}Se_{0.6}$ (red) and $MoS_1Se_1$ (blue) measured with a 488 nm laser. The inset shows that the Se concentration dependency of the optical gap showing that the bandgap of $MoS_{2(1-x)}Se_{2x}$ linearly decreases from ~1.85 eV (pure $MoS_2$) to ~1.60 eV (pure $MoSe_2$). The red dots are experimental results obtained from the PL spectra. The green dots are theoretical optical gaps at the K point obtained from LDA calculations. FIGS. 25E-G show optical images of $MoS_{2(1-x)}Se_{2x}$ triangles and the corresponding PL intensity (FIG. 25F) and peak position (FIG. 25G) mappings.

FIG. 26A shows ADF image of pristine $MoS_2$. FIG. 26B shows ADF image of Se-doped $MoS_2$ with ~12% local doping level. FIG. 26C shows higher magnification ADF image showing Se dopants. The green and cyan circles highlight single- and double-Se substituted $S_2$ sites, respectively. FIG. 26D is a comparison of experimental and simulated image intensity line profiles from single- and double-Se substitution at $S_2$ sites. The experimental profiles were obtained along the green and cyan dashed lines in FIG. 26C. FIG. 26E shows site-separated image intensity histogram analysis of pristine and Se-doped $MoS_2$ monolayers. The dashed lines are Gaussian fits to the intensity peaks. The analysis for Se-doped $MoS_2$ was based on the image shown in FIG. 26B, while the analysis for pristine $MoS_2$ was obtained from an ADF image with larger field of view. FIG. 26F shows structure model obtained from histogram analysis showing the distribution of single- and double-Se substituted $S_2$ sites. The local doping level is ~12%, corresponding to a bandgap of ~1.79 eV. Red: Mo sites; dark green: $S_2$ sites; bright green: Se+S sites; white: $Se_2$ sites.

FIG. 27A shows filtered ADF image of Se-doped bilayer $MoS_2$ with AB stacking. FIG. 27B shows schematic of the three types of sites in AB stacked bilayer $MoS_2$. FIG. 27C shows a zoom-in view of the AB stacked Se-doped bilayer $MoS_2$ exhibiting a wide range of image contrast levels. FIG. 27D shows site-separated image intensity histogram analysis of the image shown in FIG. 27A. The dashed lines are Gaussian fits to the intensity peaks. FIG. 27E-F shows structure model obtained from the histogram analysis showing the distribution of single- and double-Se substituted $S_2$ sites in the A layer with 32% local in-layer Se doping level, and in the B layer with 28% local Se doping level, respectively. Red: Mo sites; dark green: $S_2$ sites; bright green: Se+S sites; white: $Se_2$ sites. FIG. 27G shows inter-layer and inter-regional compositional variations obtained from site-separated ADF image analysis. The seven analyses, each containing between four and eleven thousand atoms, were obtained from random regions in the same sample. The inter-layer compositional variation has a mean value of ~2%, which is much smaller than the inter-regional variations. FIGS. 27H-I show the alloying degree versus Se concentration. Mo, S, and Se atoms are shown in purple, yellow and green, respectively, in FIG. 27B and FIG. 27H.

DETAILED DESCRIPTION

Figure 1:
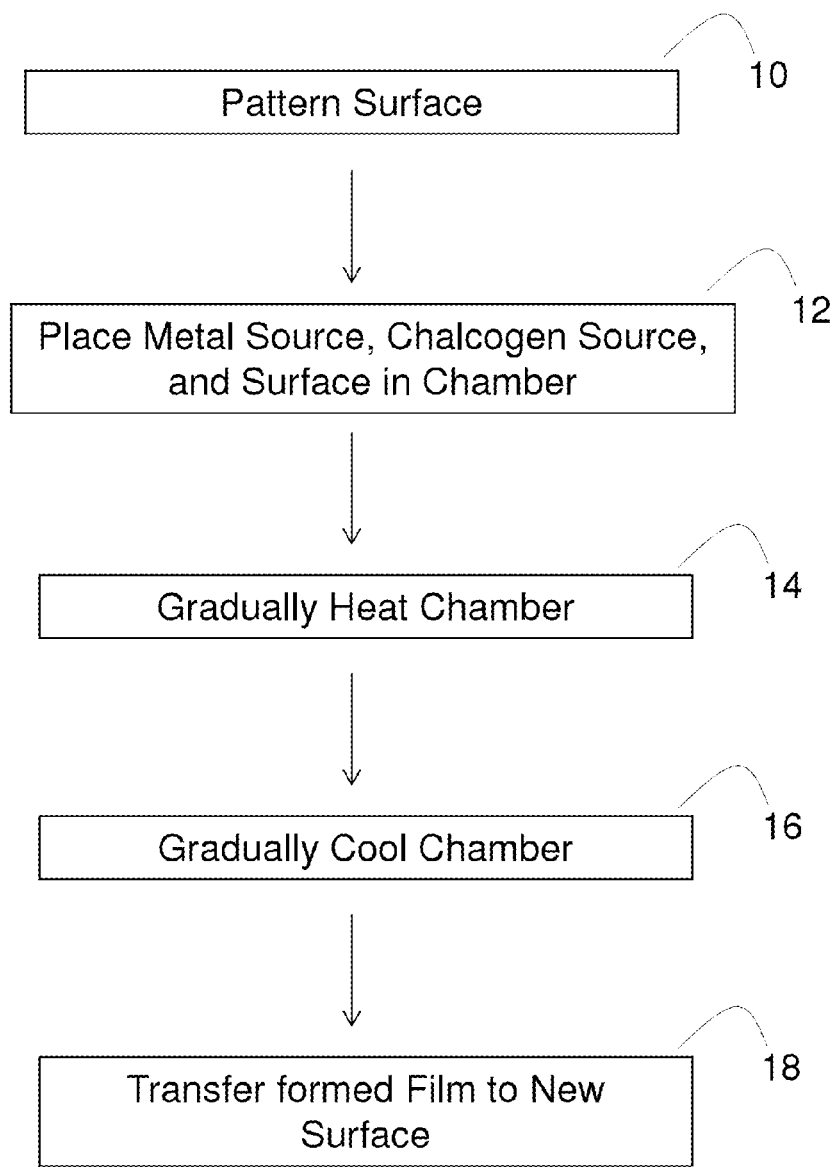
FIG. 1 provides a scheme for the fabrication of chalcogen-linked metallic films.

It is to be understood that both the foregoing general description and the following detailed description are illustrative and explanatory, and are not restrictive of the subject matter, as claimed. In this application, the use of the singular includes the plural, the word "a" or "an" means "at least one", and the use of "or" means "and/or", unless specifically stated otherwise. Furthermore, the use of the term "including", as well as other forms, such as "includes" and "included", is not limiting. Also, terms such as "element" or "component" encompass both elements or components comprising one unit and elements or components that comprise more than one unit unless specifically stated otherwise.

The section headings used herein are for organizational purposes and are not to be construed as limiting the subject matter described. All documents, or portions of documents, cited in this application, including, but not limited to, patents, patent applications, articles, books, and treatises, are hereby expressly incorporated herein by reference in their entirety for any purpose. In the event that one or more of the incorporated literature and similar materials defines a term in a manner that contradicts the definition of that term in this application, this application controls.

Graphene has shown many fascinating properties as a supplement to silicon-based semiconductor technologies. Consequently, great effort has been devoted to the development and understanding of its synthetic processes. However, graphene's high leaking current, due to its zero bandgap energy, is not suitable for many applications in electronics and optics. Recent developments in two different classes of materials (transition metal oxides and sulfides) have shown many promises to fill the existing gaps.

For instance, two-dimensional van der Waals (2D-vdW) materials have attracted considerable attention in recent years due to their optimal properties, which has led to the development of novel synthetic approaches for large scale preparation of layered materials. However, in order to make these materials more versatile, further modification of their physical and chemical properties is required. A possible way to fine-tune these properties is via chemical doping. However, only a few ternary vdW alloys have so far been realized by chemical doping.

The isomorphism of the transition metal dichalcogenide (TMD) families ($MX_2$, M: Mo, W and X: S, Se, Te) makes them great candidates to form ternary vdW alloys. For instance, the successful demonstration of molybdenum disulfide ($MoS_2$)-based field-effect transistors (FET) has prompted an intense exploration of the physical properties of few-layered $MoS_2$ films.

$MoS_2$ is a layered semiconductor with a bandgap in the range of 1.2-1.8 eV, whose physical properties are significantly thickness-dependent. For instance, a considerable enhancement in the $MoS_2$ photoluminescence has been observed as the material thickness is decreased. The lack of inversion symmetry in single-layer $MoS_2$ and developments in controlling the available valley quantum states in this material have brought valleytronic applications closer to reality. However, the large-scale synthesis of high quality $MoS_2$ atomic layers is still a challenge.

Recent top-down approaches to obtain large-area $MoS_2$ thin films have seized considerable attention. Nevertheless, the lack of uniformity in thickness and size undermines the viability of such approaches. Other scalable $MoS_2$ synthesis techniques have focused on the direct sulfurization of molybdenum-containing films. For instance, recent work on the solid phase sulfurization of molybdenum thin films revealed a straightforward method for large-area $MoS_2$ synthesis. However, the suboptimal quality of samples prepared using this synthetic route (exemplified by their low carrier mobility (0.004-0.04 $cm^{-2}V^{-1}$ $s^{-1}$), as compared to mechanically exfoliated samples (0.1-10 $cm^2V^{-1}$ $s^{-1}$) and small grain sizes (~20 nm)) remains a problem. Alternatively, the sulfurization of ammonium tetrathiomolybdate films has been attempted. Yet, this method bears a considerable level of complexity in precursor preparation and in achieving sufficient quality, which has limited its feasibility.

As such, current methods of making the aforementioned graphene analogs suffer from numerous limitations, including scalability and control over the morphology of the formed alloys. Accordingly, new methods are required to make high quality graphene analogs. The present disclosure addresses this need.

In some embodiments, the present disclosure pertains to methods of growing a chalcogen-linked metallic film on a surface in a chamber. As illustrated in FIG. 1, various embodiments of the present disclosure include one or more of the following steps: (1) patterning a surface (step 10); (2) placing a metal source, a chalcogen source, and the surface in the chamber (step 12); (3) gradually heating the chamber to facilitate the growth of the chalcogen-linked metallic film on the surface (step 14); (4) gradually cooling the chamber (step 16); and (5) transferring the film to a new surface (step 18).

As set forth in more detail herein, the methods of the present disclosure have numerous embodiments. In particular, various surfaces, metal sources, chalcogen sources, chambers, heating methods, cooling methods, and growth conditions may be utilized to grow various types of chalcogen-linked metallic films in a controllable and scalable manner.

Surfaces

Various surfaces may be utilized to grow chalcogen-linked metallic films. In some embodiments, the surface is a silicon wafer. In some embodiments, the silicon wafer contains combinations of Si and $SiO_2$ ($Si/SiO_2$). In some embodiments, the silicon wafer is a p-doped Si wafer. In some embodiments, the silicon wafer has a $Si_3N_4$ layer on its surface.

In some embodiments, the surface utilized to grow chalcogen-linked metallic films includes a sapphire wafer. In some embodiments, the surface is a highly oriented pyrolithic graphite. In some embodiments, the surface is glass.

In some embodiments, the surface utilized to grow chalcogen-linked metallic films includes boron nitride (BN), such as hexagonal boron nitride (hBN). The use of additional surfaces can also be envisioned.

In some embodiments, the surface utilized to grow chalcogen-linked metallic films is coated with a layer of silicon oxide. In some embodiments, the surface utilized to grow chalcogen-linked metallic films is un-patterned. In some embodiments, the surface utilized to grow chalcogen-linked metallic films is patterned. In more specific embodiments, the surface is a pre-patterned silicon wafer. In more specific embodiments, the surface utilized to grow chalcogen-linked metallic films includes a pattern, and the growth of the chalcogen-linked metallic film follows the pattern.

Patterning of Surfaces

In some embodiments, the methods of the present disclosure also include a step of patterning a surface that is subsequently utilized to grow chalcogen-linked metallic films. In some embodiments, the patterning of the surface occurs by photolithography. In some embodiments, the patterning of the surface occurs by electron beam deposition. Additional methods by which to pattern surfaces can also be envisioned.

Metal Source

Various metal sources may be utilized to grow chalcogen-linked metallic films. In some embodiments, the metal source includes, without limitation, metals, metal oxides, transition metals, transition metal oxides, and combinations thereof. In some embodiments, the metal source includes, without limitation, molybdenum, tungsten, titanium, and combinations thereof.

In more specific embodiments, the metal source utilized to grow chalcogen-linked metallic films is molybdenum trioxide ($MoO_3$). In some embodiments, the metal source includes, without limitation, $MoO_3$ precursors, $MoO_{3-x}$ species, $MoO_3$ nanoribbons, $MoO_3$ microcrystals, and combinations thereof. The use of additional metal sources can also be envisioned.

Chalcogen Source

Various chalcogen sources may be utilized to grow chalcogen-linked metallic films. In some embodiments, the chalcogen source includes, without limitation, oxygen, sulfur, selenium, tellurium, and combinations thereof. In some embodiments, the chalcogen source includes sulfur. In some embodiments, the sulfur that is utilized as the chalcogen source includes, without limitation, sulfides, sublimated sulfur, pure sulfur, hydrogen sulfide ($H_2S$), and combinations thereof.

In some embodiments, the chalcogen source utilized to grow chalcogen-linked metallic films includes a combination of sulfur and selenium. In some embodiments, the chalcogen source includes sublimated sulfur and selenium powder. The utilization of additional chalcogen sources can also be envisioned.

Chambers

Various chambers may be utilized to grow chalcogen-linked metallic films. In some embodiments, the chamber is an enclosed structure that is capable of housing a surface, a chalcogen source, and a metal source. In some embodiments, the chamber is a furnace. The utilization of additional chambers can also be envisioned.

In some embodiments, the chamber may be under a flow of an inert gas during the growth of chalcogen-linked metallic films. In some embodiments, the inert gas includes, without limitation, argon, nitrogen, helium, and combinations thereof. In some embodiments, the inert gas is nitrogen. In some embodiments, the nitrogen is continuously streamed through the chamber with a flow rate of 200 sccm.

Gradual Heating of Chamber

In some embodiments, the heating of the chamber leads to the formation of chalcogen-linked metallic films. Without being bound by theory, it is envisioned that heating leads to the deposition of the chalcogen source and the metal source onto the surface. In some embodiments, the chalcogen source and the metal source may be deposited onto a surface by chemical vapor deposition. In some embodiments, the chalcogen source and the metal source may be deposited onto a surface by dispersion Thereafter, the heating facilitates growth of the chalcogen-linked metallic film from the chalcogen source and the metal source on the surface. In some embodiments, the growth of the chalcogen-linked metallic film occurs by formation of nucleation sites on the surface that contain metal sources that are linked to chalcogen sources. In some, embodiments, the nucleation sites merge to form the chalcogen-linked metallic film on the surface.

Various methods may also be utilized to heat chambers. In some embodiments, a chamber is heated gradually during growth. In some embodiments, the gradual heating of the chamber occurs by gradually heating the chamber to about 850° C. In some embodiments, the gradual heating of the chamber occurs by heating the chamber at a rate of between about 1° C. per minute to about 50° C. per minute.

In more specific embodiments, the gradual heating of the chamber occurs by: (1) heating the chamber from room temperature to about 550° C. at a rate of between about 20° C./min; and (2) heating the chamber from about 550° C. to about 850° C. at a rate of about 5° C./min. In some embodiments, the gradual heating of the chamber occurs by heating the chamber to at least about 550° C.-650° C., and then gradually heating the chamber to at least about 850° C. over a period of 150 minutes. Additional methods by which to heat a chamber can also be envisioned.

Gradual Cooling of Chamber

In some embodiments, the methods of the present disclosure also include a step of cooling the chamber after the heating of the chamber. In some embodiments, the cooling of the chamber occurs by gradually cooling the chamber. In some embodiments, the chamber is cooled to room temperature over a period of one hour. In some embodiments, the chamber is naturally cooled back to room temperature. Additional methods of cooling the chamber can also be envisioned.

Control of Film Growth

In some embodiments, the present disclosure can also include methods of growing chalcogen-linked metallic films in a controllable manner. For instance, in some embodiments, the methods of the present disclosure can also include a step of controlling a morphology of the chalcogen-linked metallic film by adjusting one or more growth parameters. In some embodiments, the controllable morphology of the chalcogen-linked metallic film includes the shape, size, or thickness of the film. In some embodiments, the adjustable growth parameters that can control the morphology of the chalcogen-linked metallic films include, without limitation, chalcogen source concentration, chamber pressure, metal source concentration, chamber temperature, type of surface, and combinations thereof.

In more specific embodiments, the morphology of chalcogen-linked metallic films is controlled by adjusting the chamber pressure. For instance, in some embodiments, the chamber pressure may be adjusted between about 0.5-1 KPa, 1-4 KPa, 4-10 KPa, 10-40 KPa, 40-80 KPa, or 80-120 KPa in order to obtain chalcogen-linked metallic films with a desired morphology.

In some embodiments, the shape of chalcogen-linked metallic films is controlled by controlling the pattern on a surface such that the growth of chalcogen-linked metallic films follows the pattern. In some embodiments, the morphology of chalcogen-linked metallic films is controlled by controlling the nucleation of the metal source and the chalcogen source on the surface. For instance, in some embodiments, nucleation is controlled on surfaces by patterning the surface such that the nucleation follows the edges of the patterns.

In some embodiments, the shape or size of the nucleation sites is controlled by adjusting the chamber pressure. For instance, in some embodiments, the size of the nucleation sites are controlled by adjusting the pressure in the chamber, where an increase in chamber pressure decreases the size of the nucleation sites, and a decrease in chamber pressure increases the size of the nucleation sites. In some embodiments, the shape of the nucleation sites are controlled by adjusting the pressure in the chamber, where an increase in chamber pressure forms triangular nucleation sites, and a decrease in chamber pressure forms square-like nucleation sites.

In some embodiments, the shape or size of the nucleation sites is controlled by adjusting the concentration of the chalcogen source (e.g., sulfur). For instance, in some embodiments, the shape of the nucleation sites is controlled by adjusting the chalcogen source concentration, where an increase in chalcogen source concentration forms triangular nucleation sites, and a decrease in chalcogen source concentration forms square-like nucleation sites.

Film Transfer

In further embodiments, the methods of the present disclosure also include a step of transferring the chalcogen-linked metallic film to a new surface. For instance, in some embodiments, a chalcogen-linked metallic film is transferred to a new surface by using conventional polymer-based transfer techniques. Additional methods of film transfer can also be envisioned.

Formed Films

The methods of the present disclosure can be utilized to form various types of chalcogen-linked metallic films. For instance, in some embodiments, the chalcogen-linked metallic film includes a single layer. In some embodiments, the chalcogen-linked metallic film includes multiple layers, such as two layers. In some embodiments, the chalcogen-linked metallic film includes predominantly single layers with small areas that contain two or few layers.

In some embodiments, the chalcogen-linked metallic film is a single-crystalline film. In some embodiments, the chalcogen-linked metallic film is a single-crystalline film with a hexagonal structure.

The methods of the present disclosure can also be utilized to form chalcogen-linked metallic films with various types of structures. For instance, in some embodiments, the chalcogen-linked metallic films include sulfated metallic films. In some embodiments, the chalcogen-linked metallic films include transition metal dichalcogenides. In some embodiments, the chalcogen-linked metallic films include, without limitation, $MoS_2$, $MoSe_2$, $MoS_1Se_1$, $WS_2$, $WSe_2$, $TiS_2$, and combinations thereof.

In some embodiments, the chalcogen-linked metallic film includes $MoS_{2(1-x)}Se_{2x}$. In some embodiments, x is at least one of 0.1, 0.3, 0.50 and 0.75. In some embodiments, the chalcogen-linked metallic film is $MoS_{1.4}Se_{0.6}$. In some embodiments, the chalcogen-linked metallic film is $MoS_1Se_1$.

The chalcogen sources may be linked to metal sources in the chalcogen-linked metallic films of the present disclosure through various types of interactions. For instance, in some embodiments, chalcogen sources may be linked to metal sources through ionic bonds, covalent bonds, non-covalent bonds, van der Waals forces, electrostatic interactions, London dispersion forces, and combinations thereof.

Applications and Advantages

The methods of the present disclosure can be utilized to form various types of chalcogen-linked metallic films in a controllable and scalable manner. For instance, in some embodiments, the methods of the present disclosure can be used to effectively produce large-area or patterned single- or bi-layered chalcogen-linked metallic films. In addition, control of the metal source or chalcogen source concentration can be utilized to halt the growth process and prepare isolated nucleation sites with unique geometrical features, such as triangles and stars.

As such, the methods of the present disclosure can be used to make chalcogen-linked metallic films for a variety of applications. For instance, in some embodiments, chalcogen-linked metallic films can be used for $CO_2$ and sub-millimeter lasers and non-linear optical devices. Additional applications can also be envisioned.

Additional Embodiments

Reference will now be made to more specific embodiments of the present disclosure and experimental results that provide support for such embodiments. However, Applicants note that the disclosure below is for illustrative purposes only and is not intended to limit the scope of the claimed subject matter in any way.

Example 1

Vapor Phase Growth and Grain Boundary Structure of Molybdenum Disulfide Atomic Layers Single-layered molybdenum disulfide ($MOS_2$) with a direct bandgap is a promising two-dimensional material that goes beyond graphene for the next generation of nanoelectronics. In this Example, Applicants report the controlled vapor phase synthesis of molybdenum disulfide atomic layers and elucidate a fundamental mechanism for the nucleation, growth, and grain boundary formation in its crystalline monolayers. Furthermore, a nucleation-controlled strategy is established to systematically promote the formation of large-area, single- and few-layered films. Using high-resolution electron microscopy imaging, the atomic structure and morphology of the grains and their boundaries in the polycrystalline molybdenum disulfide atomic layers are examined, and the primary mechanisms for grain boundary formation are evaluated. Grain boundaries consisting of 5- and 7-member rings are directly observed with atomic resolution, and their energy landscape is investigated via first-principles calculations. The uniformity in thickness, large grain sizes, and optimal electrical performance signify the high quality and scalable synthesis of the molybdenum disulfide atomic layers.

In this Example, Applicants have developed a CVD-based procedure for the large-area synthesis of highly crystalline $MoS_2$ atomic layers by vapor-phase molybdenum trioxide ($MoO_3$) sulfurization. Traditionally, the sulfurization of $MoO_3$ has been the primary approach in $MoS_2$ nanomaterial synthesis and it has been widely studied. Making use of its low melting and evaporation temperatures, it was recently demonstrated that $MoO_3$ is a suitable precursor for chemical vapor deposition (CVD) of $MoS_2$ thin films.

In this Example, Applicants also evaluate the growth process, grain morphology, and grain boundary structure of the polycrystalline $MoS_2$ atomic layers and characterize their corresponding electrical performance.

Figure 2:
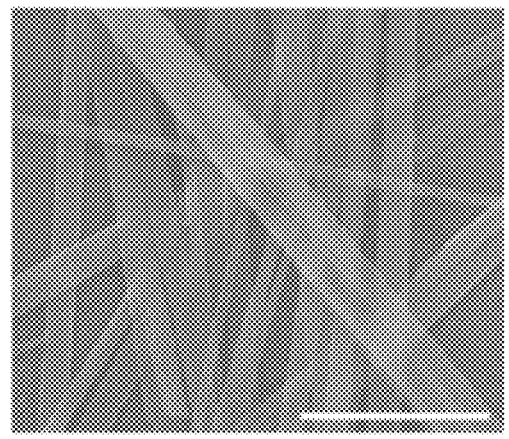
FIG. 2 provides data relating to a setup for fabrication of single-layered molybdenum disulfide ($MOS_2$) from molybdenum trioxide ($MoO_3$) and a sulfur source.
Figure 2:
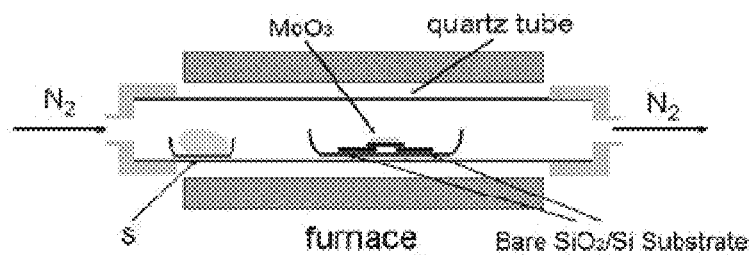
Figure 2:
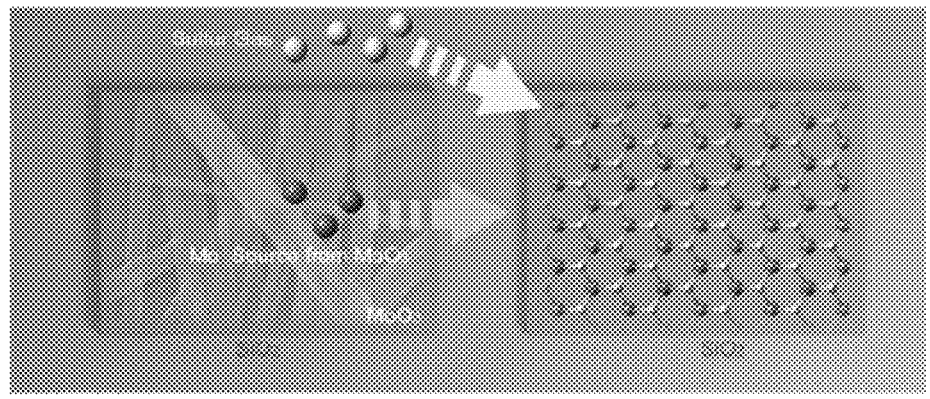

To understand the growth process of $MoS_2$, the source supply was controlled by dispersing $MoO_3$ nanoribbons with varied concentrations on a substrate, away from the designated growth region, while all other parameters were kept constant. (FIG. 2). The $MoO_3$ nanoribbons provide a robust method for dispersion, allowing for the examination of the different stages involved in the growth process. In this configuration, the $MoO_3$ precursors are dispersed on $SiO_2$/Si substrates and placed in the center of the quartz container. Next, several bare or patterned clean substrates that are designated for $MoS_2$ growth are positioned on the sides. The sublimated sulfur is placed close to the opening of the furnace, where it evaporates as the temperature at the center of the furnace approaches 550° C. Nitrogen is continuously streamed through the chamber with a flow rate of 200 sccm.

Figure 3:
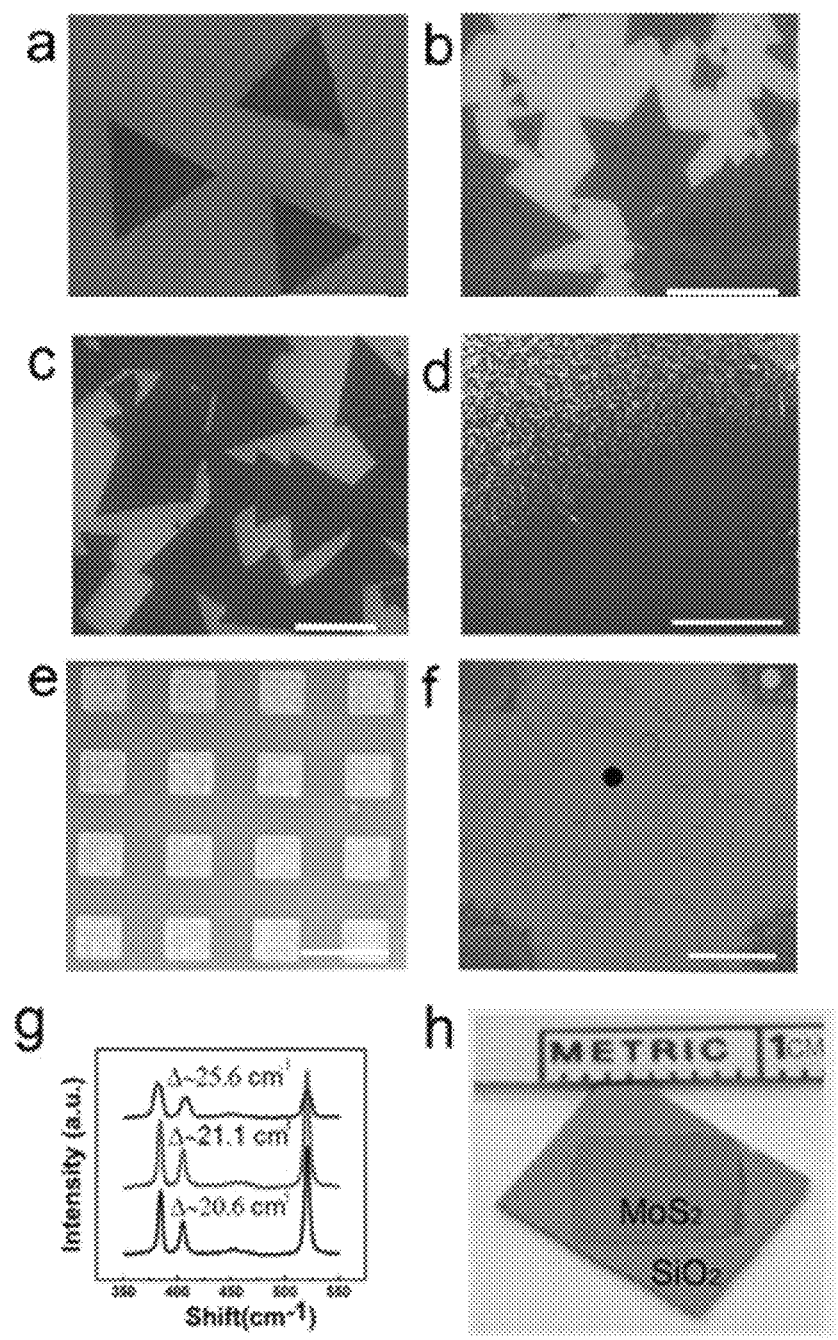
FIG. 3 provides data relating to the growth process of $MoS_2$ films and controlled nucleation.

As summarized in FIG. 3, the above experiments show that the synthesis of $MoS_2$ was limited by the diffusion of vapor-phase $MoO_{3-x}$. For instance, decreasing the density of dispersed nanoribbons systematically slows or stops the growth at certain points, providing means to explore the growth process.

In addition, several stages were observed during the $MoS_2$ atomic layer growth. Initially, small triangular domains were nucleated at random locations on the bare substrate (FIG. 3A). Then, the nucleation sites continued to grow and formed boundaries when two or more domains met (FIGS. 3B-C), resulting in a partially continuous film. This process can eventually extend into large-area single-layered $MoS_2$ continuous films if sufficient precursor supply and denser nucleation sites are provided (FIG. 3D).

Figure 4:
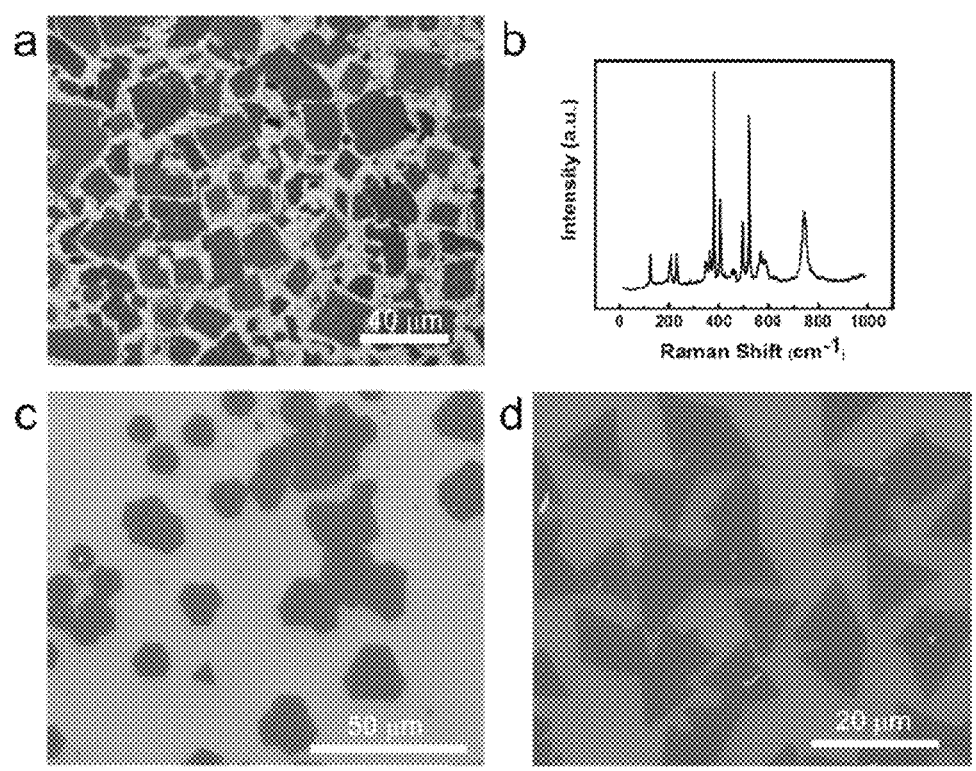
FIG. 4 provides the effect of sulfur concentration on the growth process of $MoS_2$ films.
Figure 5:
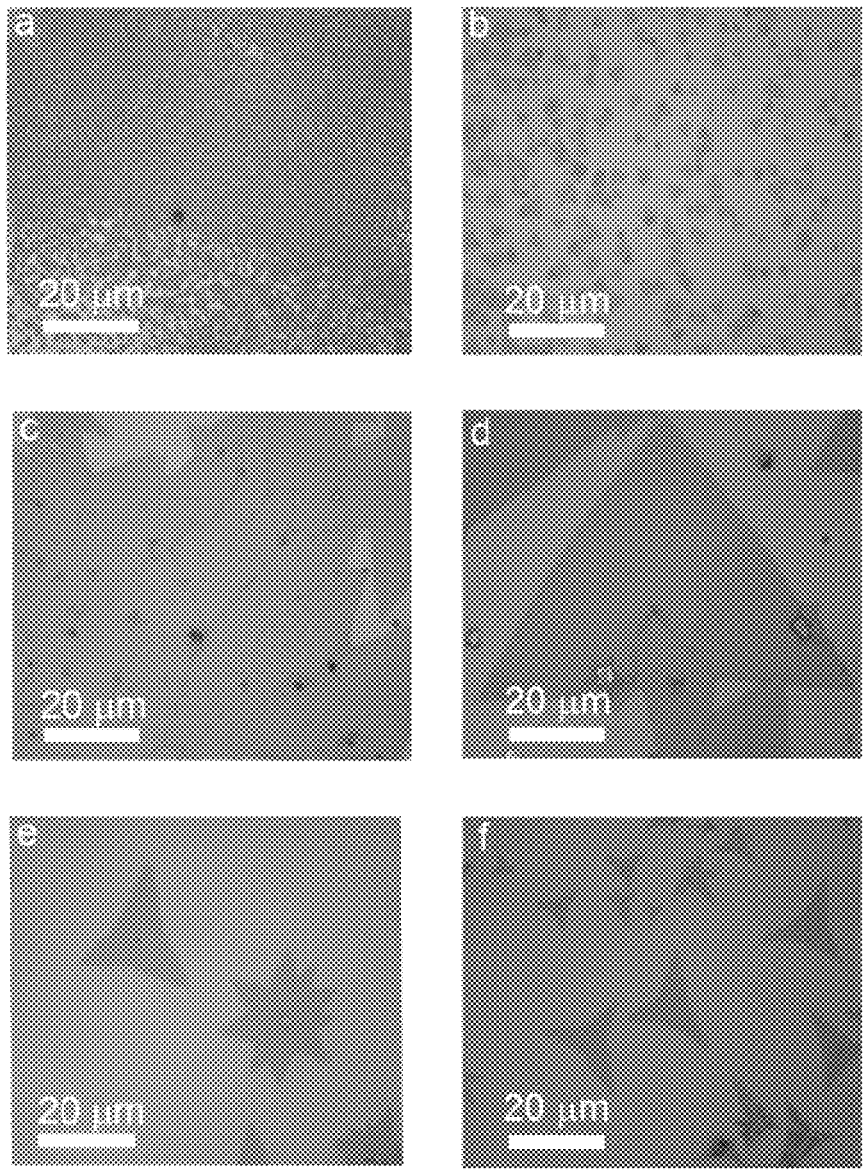
FIG. 5 provides the effect of positive pressure on the growth processes of $MoS_2$ films.

Additionally, Applicants determined sulfur concentration and chamber pressure as two parameters that control the prospects of the material growth. (FIGS. 4-5). These parameters and their synergistic effects on the morphology, nucleation, and growth of $MoS_2$ crystals were used to control the $MoS_2$ synthesis in this Example, as detailed in the materials and methods sections herein.

These observations show that, in contrast to graphene that nucleates abundantly on copper substrates without any treatment, the limiting factor in the growth of large-area, highly crystalline $MoS_2$ films is the rare and complicated nucleation process of this material on bare $SiO_2$ substrates. These observations are also in agreement with previous studies on CVD-grown $MoS_2$. The observations also elucidate the importance of efficient control of nucleation, which is desirable for the large-area growth of $MoS_2$ atomic layers.

Figure 6:
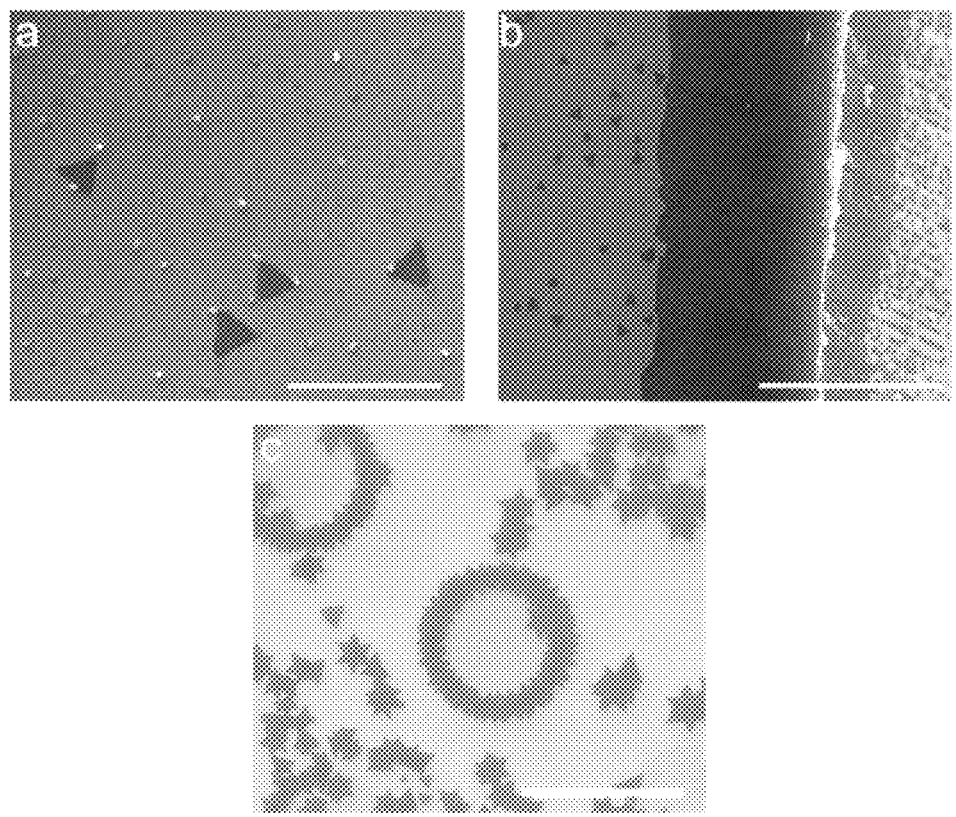
FIG. 6 provides data relating to the controlled nucleation and growth of $MoS_2$ and common features observed during synthesis of $MoS_2$ on substrates.
Figure 7:
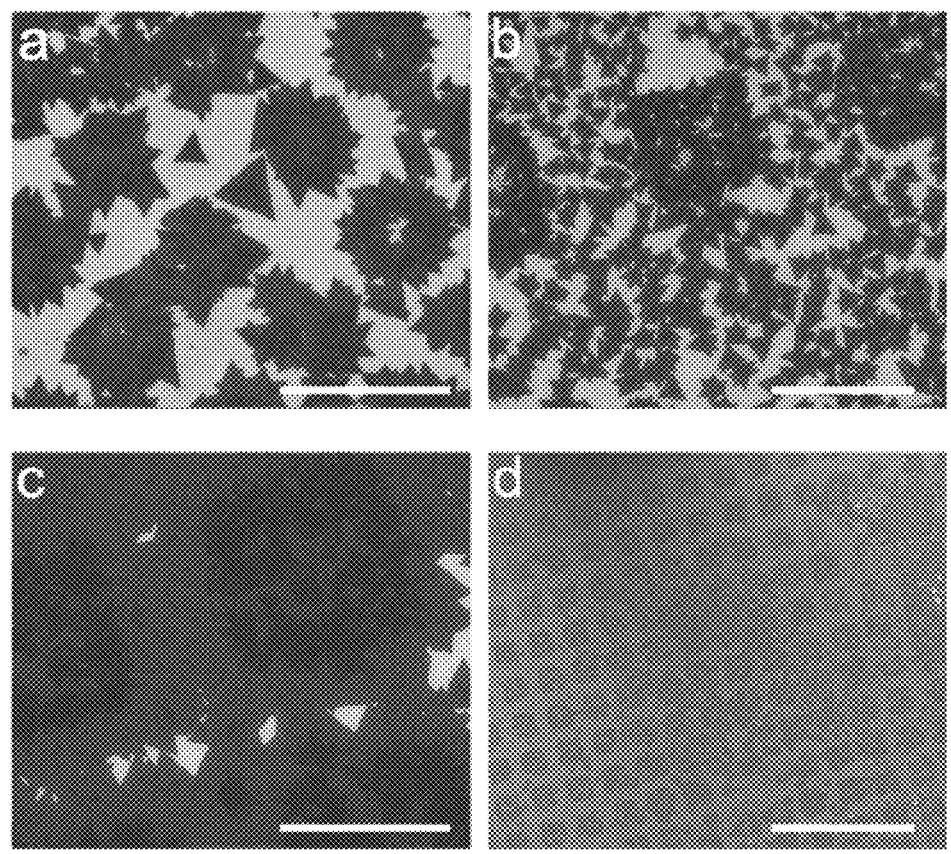
FIG. 7 provides SEM images relating to the edge based nucleation controlled growth process of $MoS_2$ films. SEM images show the nucleation controlled growth process through the patterning of silicon substrates. These patterns are discernable by the contrast resulting from dense nucleation. Film growth is initiated by the nucleation and growth of triangular single-crystalline $MoS_2$. A sufficient supply of $MoO_3$ results in further growth and emergence of such triangles. Ultimately, continuous large-area films with high level of crystallinity form. The scale bars in FIGS. 7A-D are 100, 50, 50, and 400 μm, respectively.

Additional experimental results show that $MoS_2$ triangular domains and films are commonly nucleated and formed in the vicinity of the substrates' edges, scratches, dust particles, or rough surfaces. (FIG. 6). Applicants utilized this phenomenon to control the nucleation by strategically creating step edges on substrates using conventional lithography processes (FIG. 3E). The patterned substrates with uniform distribution of rectangular $SiO_2$ pillars (40×40 $\mu m^2$ in size, 40 $\mu m$ apart, and ~40 nm thick) were directly used in the CVD process for $MoS_2$ growth (FIG. 3E). The pillars facilitate a high density of domain nucleation and the continued growth allows for the formation of large-area continuous films (FIG. 7).

Raman spectroscopy measurements indicate that the $MoS_2$ atomic layers grow on the surface of the pillars as well as on the valley space between them, suggesting that both the surface roughness and edges may contribute to the nucleation process (FIGS. 3F-G). The as-grown films are predominantly single-layered, with small areas consisting of two or few layers at the preferred nucleation sites (FIG. 3G).

Figure 8:
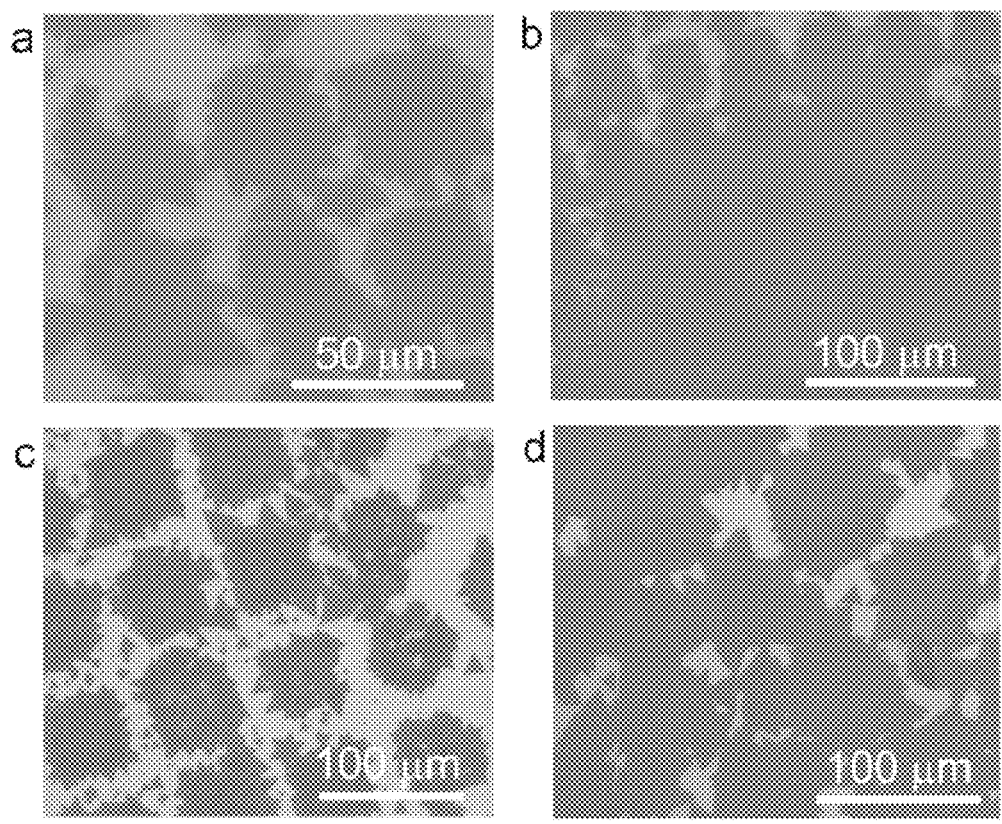
FIG. 8 provides data relating to methods for control of crystallinity in $MoS_2$ films through pattern-size variation.
Figure 9:
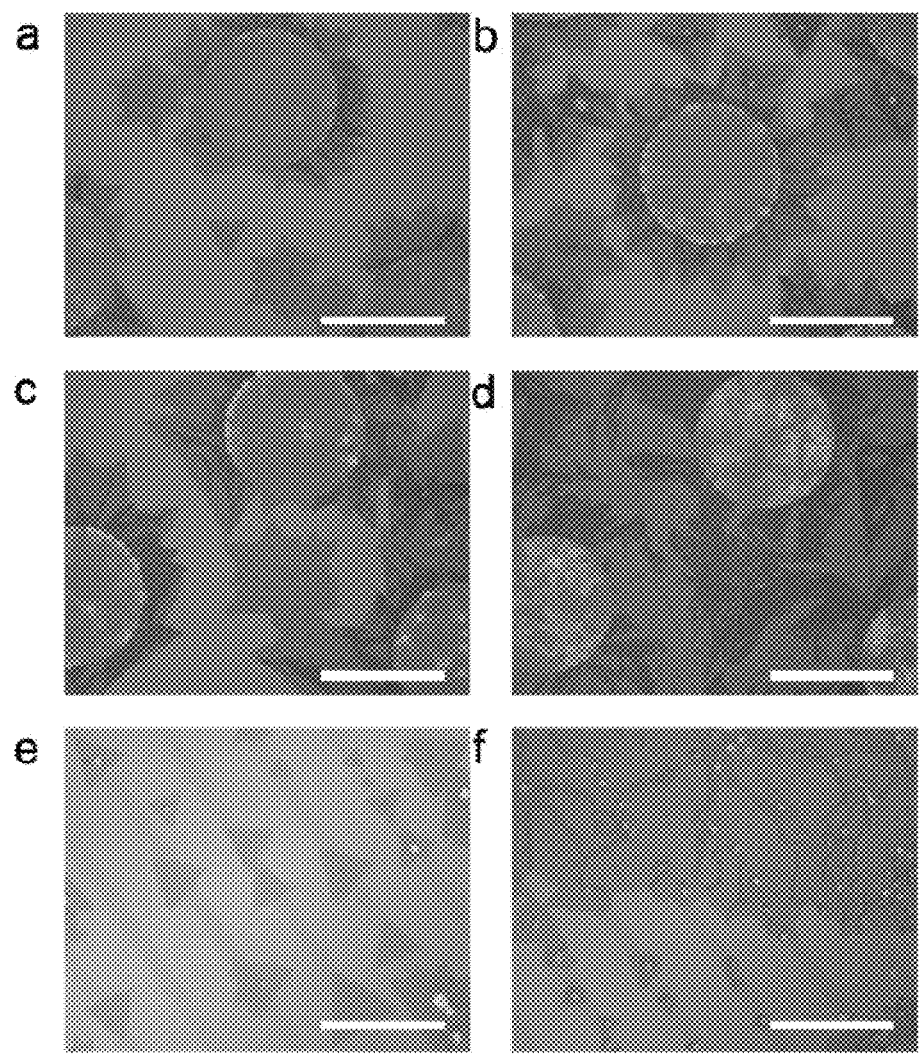
FIG. 9 provides data relating to variation in patterns for the controlled nucleation and growth process.

Applicants' observations show that the pattern-based growth process follows pressure and sulfur concentration dependencies similar to the growth of $MoS_2$ on pristine substrates. The strategies to enhance this approach, such as variations in the size and geometry of the pillars, and their effects on the growth process, are discussed in FIGS. 8-9. The edge-based nucleation approach utilized in this Example resembles some observations and theoretical predictions in the growth of other layered materials.

Theoretical studies have revealed a significant reduction in the nucleation energy barrier of graphene at step edges, as compared to flat surfaces of transition metal substrates. Without being bound by theory, Applicants propose that similar edge-based catalytic processes are also involved in the initiation of $MoS_2$ growth. The lithography method applied in the preparation of silicon oxide patterns and step edges on insulating substrates provides a unique and robust strategy for the growth of large-area, high-quality $MoS_2$ films that can be readily transferred to any substrate or applied to fabricate devices (FIG. 3H). This strategy can potentially be adopted to grow large-area $MoS_2$ films on other insulating substrates, such as hexagonal boron nitride, to take advantage of its atomically smooth surface and possible electrical performance enhancement.

Further experiments reveal that $MoS_2$ growth on both patterned and bare substrates follows the same process: the initial nucleation of triangular domains and their subsequent growth and coalescence. Applicants have observed that the nucleation and growth of the triangular domains, as well as the formation of boundaries among these domains, play an important role in the development of large-area $MoS_2$ atomic layers. Therefore, the characterization of the triangular domains becomes significant to understanding the advantages and limitations of this synthetic route and the proposed growth mechanism.

Figure 10:
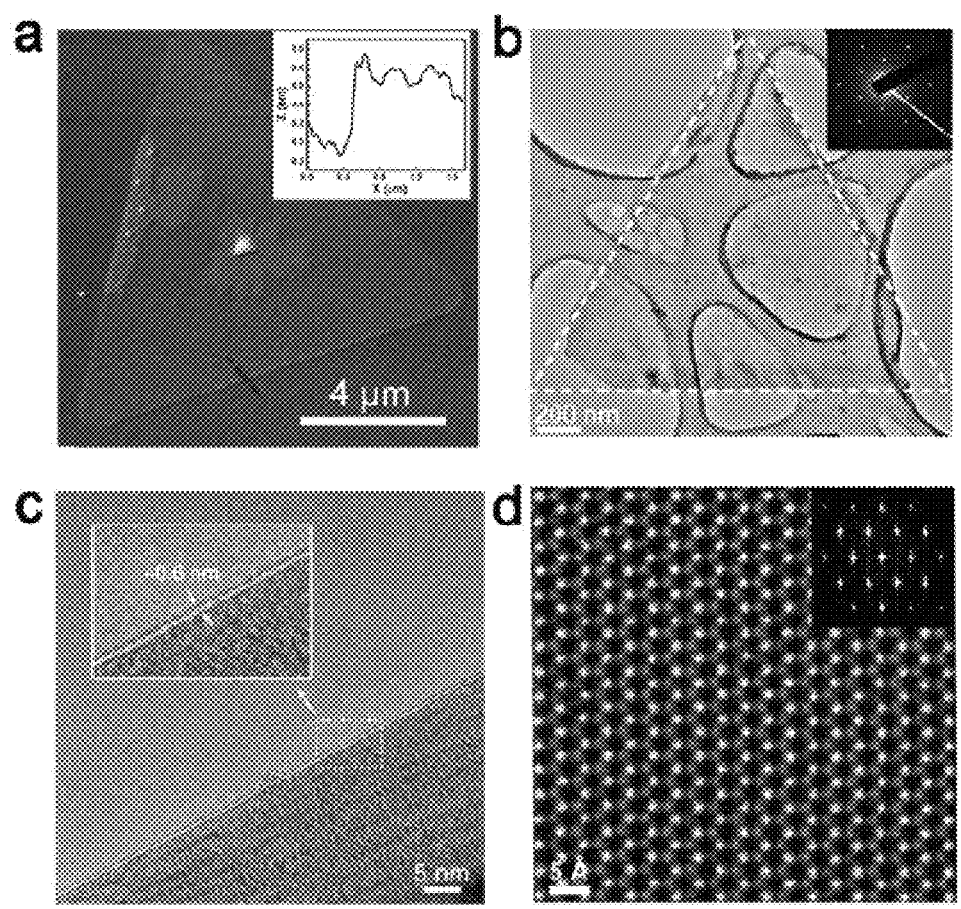
FIG. 10 shows data relating to the characterization of $MoS_2$ triangular domains.
Figure 11:
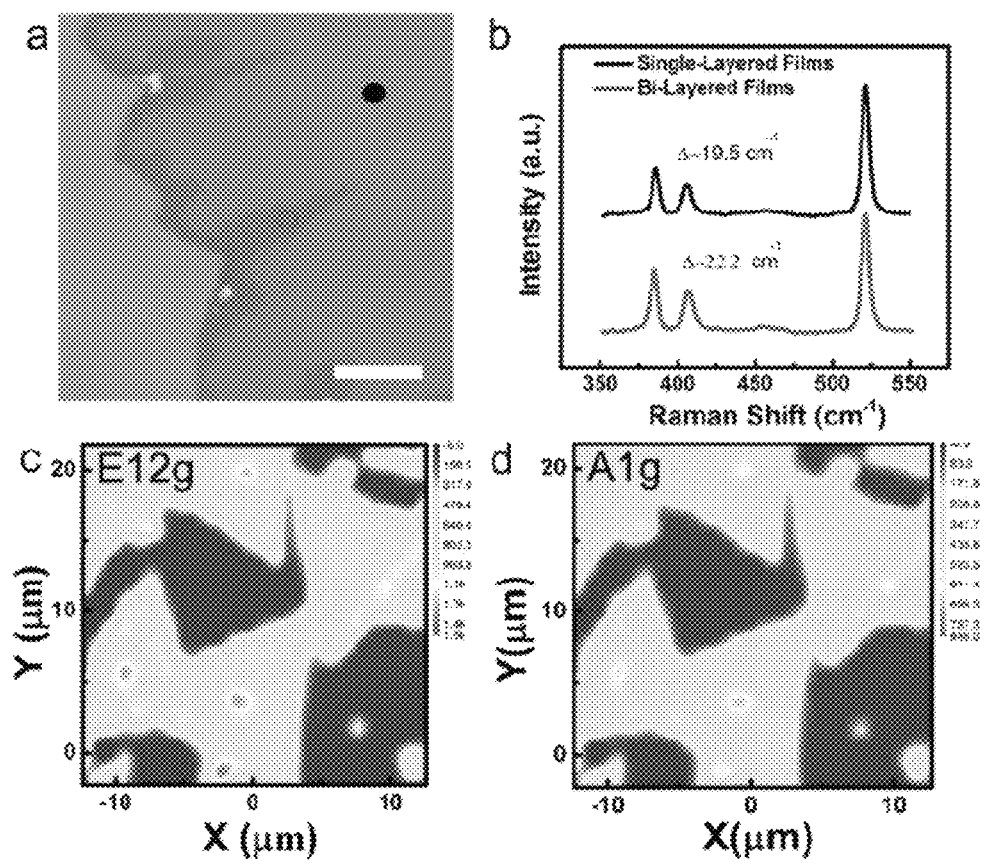
FIG. 11 shows various data relating to the thickness and chemical characterization of as-synthesized $MoS_2$ samples.
Figure 12:
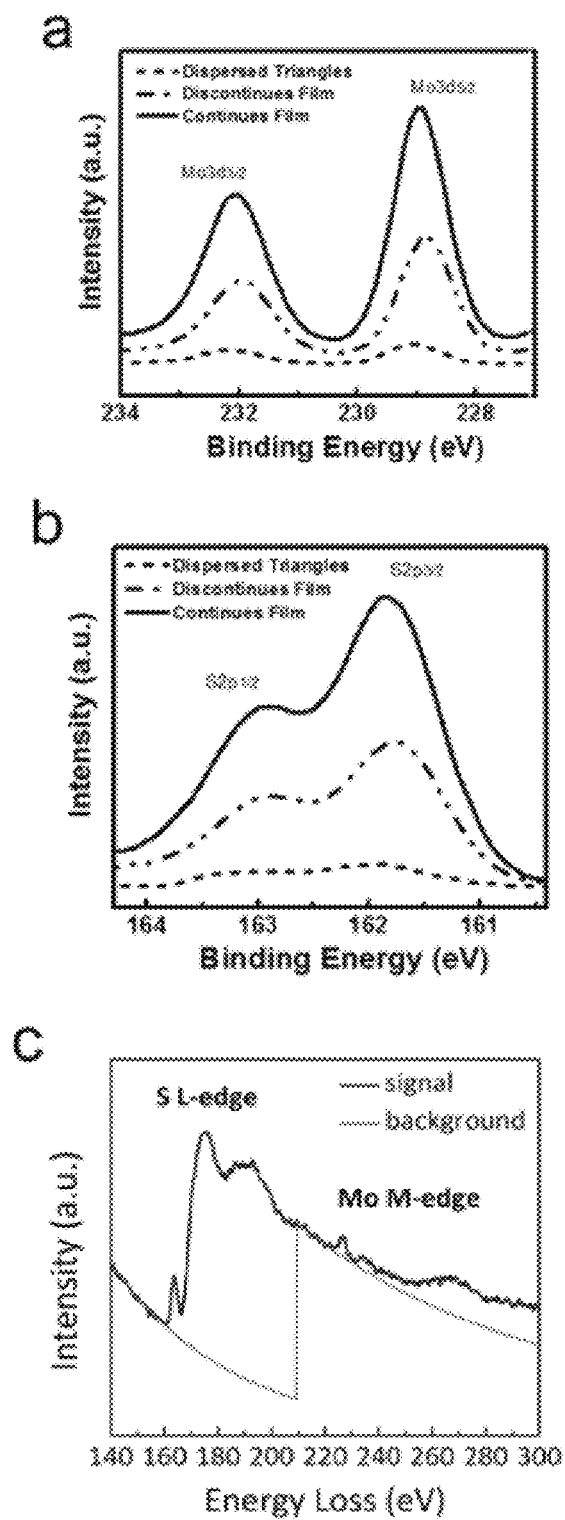
FIG. 12 shows data relating to the chemical analysis of $MoS_2$ single triangular domains and films.

A representative atomic force microscopy (AFM) image of a $MoS_2$ domain is shown in FIG. 10A. The thickness of these triangles is approximately 0.7 nm, corresponding to one $MoS_2$ atomic layer, with high level of uniformity in thickness, as also confirmed by Raman spectroscopy (FIG. 11). The chemical composition of the sample was confirmed by X-ray photoelectron spectroscopy (XPS) and electron energy loss spectroscopy (EELS) analysis (FIG. 12). The equilateral geometry of the triangles with perfect 60° angles suggests the single-crystalline nature of these nanostructures, with edges parallel to a specific lattice orientation (FIG. 10A).

Transmission electron microscopy (TEM) and aberration-corrected scanning transmission electron microscopy (STEM) were then applied to examine the crystal structure of $MoS_2$ triangles and atomic layers. The selected area electron diffraction (SAED) pattern from a typical $MoS_2$ triangle (FIG. 10B) presents only one set of six-fold symmetry diffraction spots, confirming their single-crystallinity with hexagonal structure. The atomic structure of the single-layer triangles is shown by the STEM annular dark field (ADF) image in FIG. 10C, where the alternating brighter and dimmer atomic positions in the hexagonal rings correspond to Mo and $S_2$, respectively. Quantitative analysis of the STEM-ADF image intensity confirms that the sample is single-layer $MoS_2$ with two S atoms at each $S_2$ site. Moreover, a uniform and almost defect-free structure was observed across the entire single-crystal domain. Nevertheless, through the formation of grain boundaries when these single-crystalline domains merge, polycrystalline films of $MoS_2$ form. It is known that the grain boundaries in polycrystalline two-dimensional materials degrade their physical properties and, to overcome these problems, large grain sizes are desirable. Therefore, characterization of crystallinity in the large-area $MoS_2$ films is necessary to assess the quality of the material.

Figure 13:
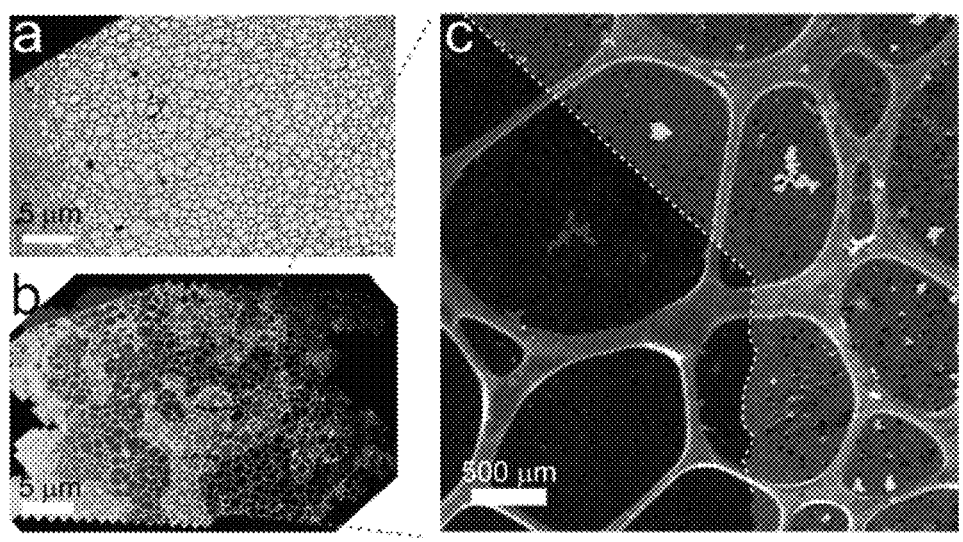
FIG. 13 shows bright field (BF) and dark field (DF) TEM images of $MoS_2$ films.

Next, Applicants evaluated the crystallinity of the large-area continuous $MoS_2$ films by examining the microstructure of these atomic layers using dark-field (DF) TEM imaging. A total of 507 DF TEM images acquired from the same diffraction spot were used to construct the DF TEM image (FIG. 13). The ~15×15 $\mu m^2$ region shown in FIG. 14A contains two areas of single-layer $MoS_2$ and demonstrates a contrast between the different areas of uniform crystal orientations. The white regions represent single-layered $MoS_2$ with the same lattice orientation. The DF TEM images demonstrate the large grain size (several tens of microns) of the $MoS_2$ films. This is consistent with the average size of the triangular domains observed in experiments before they coalesce, and reaffirms the hypothesis for the $MoS_2$ growth process. Additionally, the thickness uniformity over regions greater than tens of microns further exemplifies the high quality of these samples. Nevertheless, grain boundaries that mediate the crystal orientation transitions between the grains are one of the major sources of defects in materials that warrant closer scrutiny.

Figure 14:
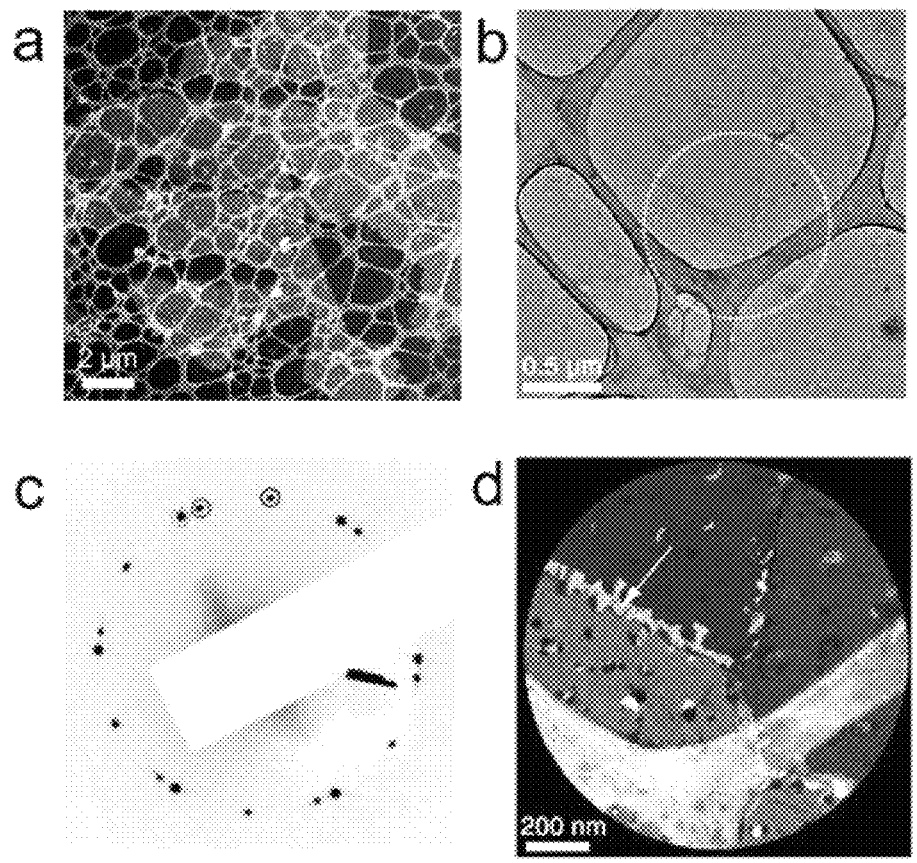
FIG. 14 shows grains and grain boundaries in $MoS_2$ films.

An example of a grain boundary in $MoS_2$ atomic layers is shown in FIG. 14B, where the SAED pattern collected from the highlighted area reveals three sets of six-fold symmetry spots (FIG. 14C), corresponding to relative rotations of ~5° and 30° in crystal orientation among the three grains. The location of the grains and their boundaries can be identified from the false-colored DF TEM image presented in FIG. 14D.

Figure 15:
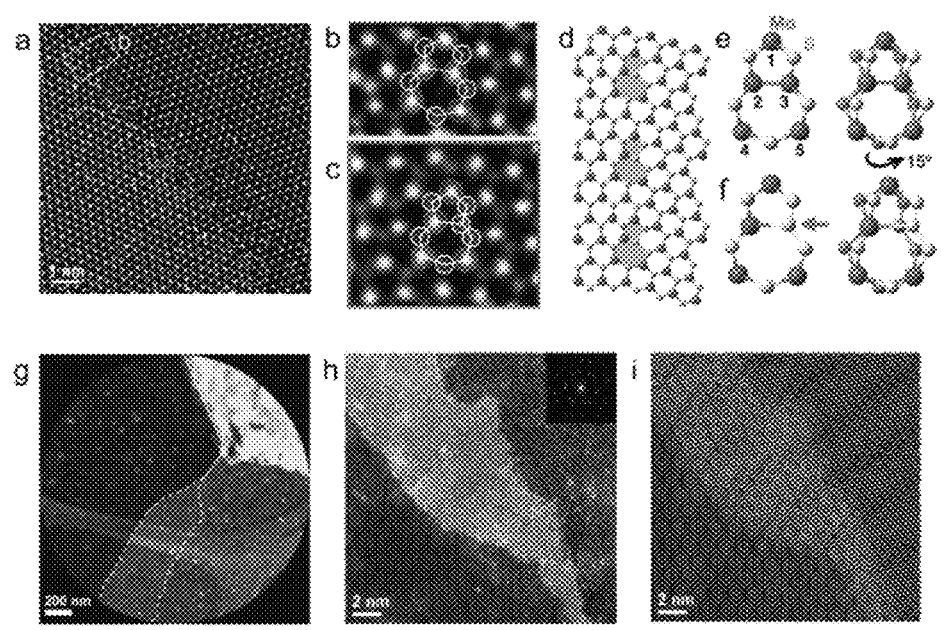
FIG. 15 shows atomic configurations for grain boundaries and overlapped junctions in the single-layered $MoS_2$ films.
Figure 16:
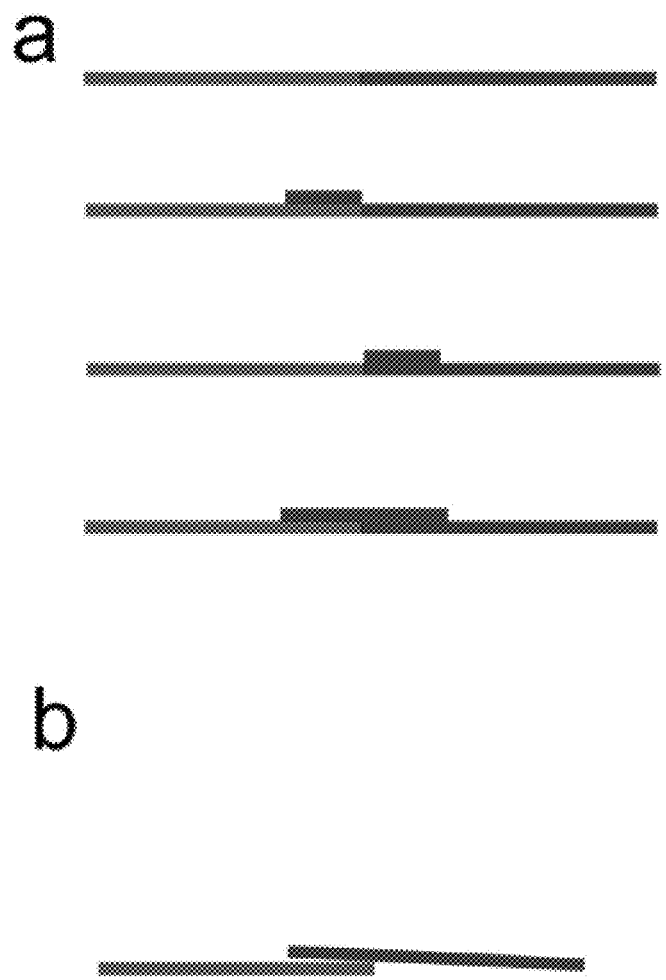
FIG. 16 shows two modes of boundary formation. Grains with different orientations are indicated by red and blue lines.
Figure 17:
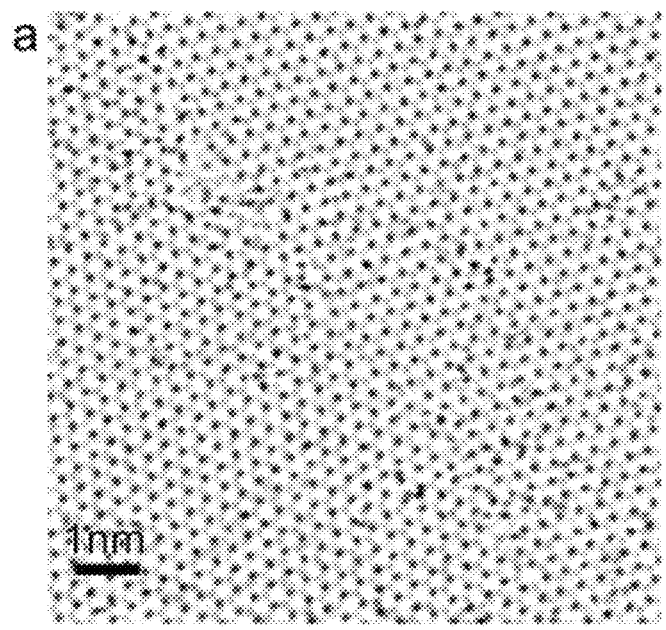
FIG. 17 shows a burgers vector analysis of the $MoS_2$ grain boundaries.
Figure 17:
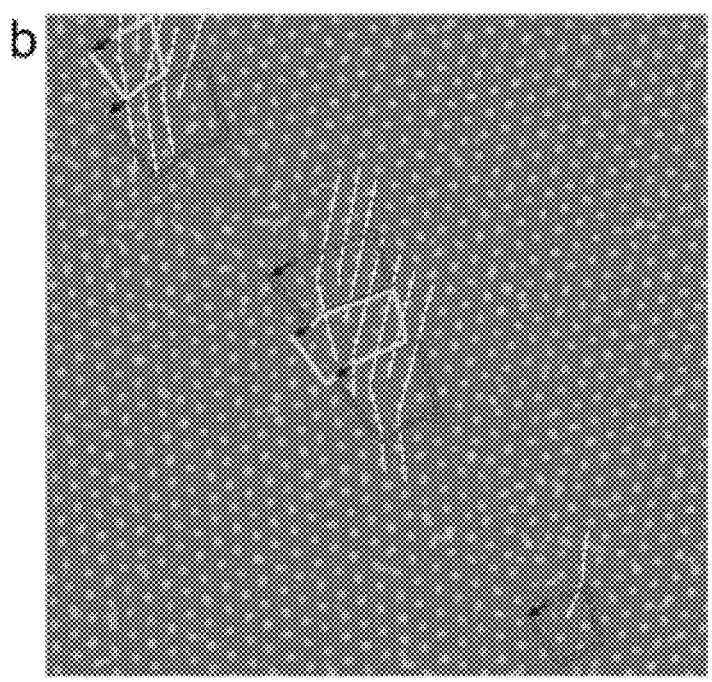

Two possible mechanisms of boundary formation in $MoS_2$ were identified. In some instances, traditional grain boundaries consisting of chemical bonds between the two single-layered grains are formed and the in-plane growth stops (FIGS. 14D and 15A). At times, the growth could proceed with the nucleation of a second layer at the boundaries (FIGS. 16-17 and 14D), as seen in the pale blue stripe along the grain boundary between the green and blue grains shown in FIG. 14D (indicated by the white arrow). This is a feature that is also visible in optical images that can be used to distinguish the grain boundaries. The other mode of boundary formation occurs when one grain continues to grow on top of the other without forming chemical bonds between the two grains, resulting in an overlapped bi-layered region (FIGS. 16B and 15G-I). The mechanisms of grain boundary formation can be explored by taking a closer look at the structure of the grain junctions in $MoS_2$ atomic layers.

A combination of aberration-corrected STEM-ADF imaging and first-principles calculations based on density functional theory (DFT) was applied in order to provide an in-depth analysis of the atomic configuration at grain boundaries in single-layer $MoS_2$. It has been well-documented that grain boundaries in graphene can be described as arrays of dislocations formed by 5|7 fold carbon rings. However, little is known about the detailed grain boundary structures in binary systems such as h-BN and $MoS_2$. Identification of the detailed atomic structure of dislocations and grain boundaries in h-BN and $MoS_2$ has been primarily a theoretical investigation.

Figure 18:
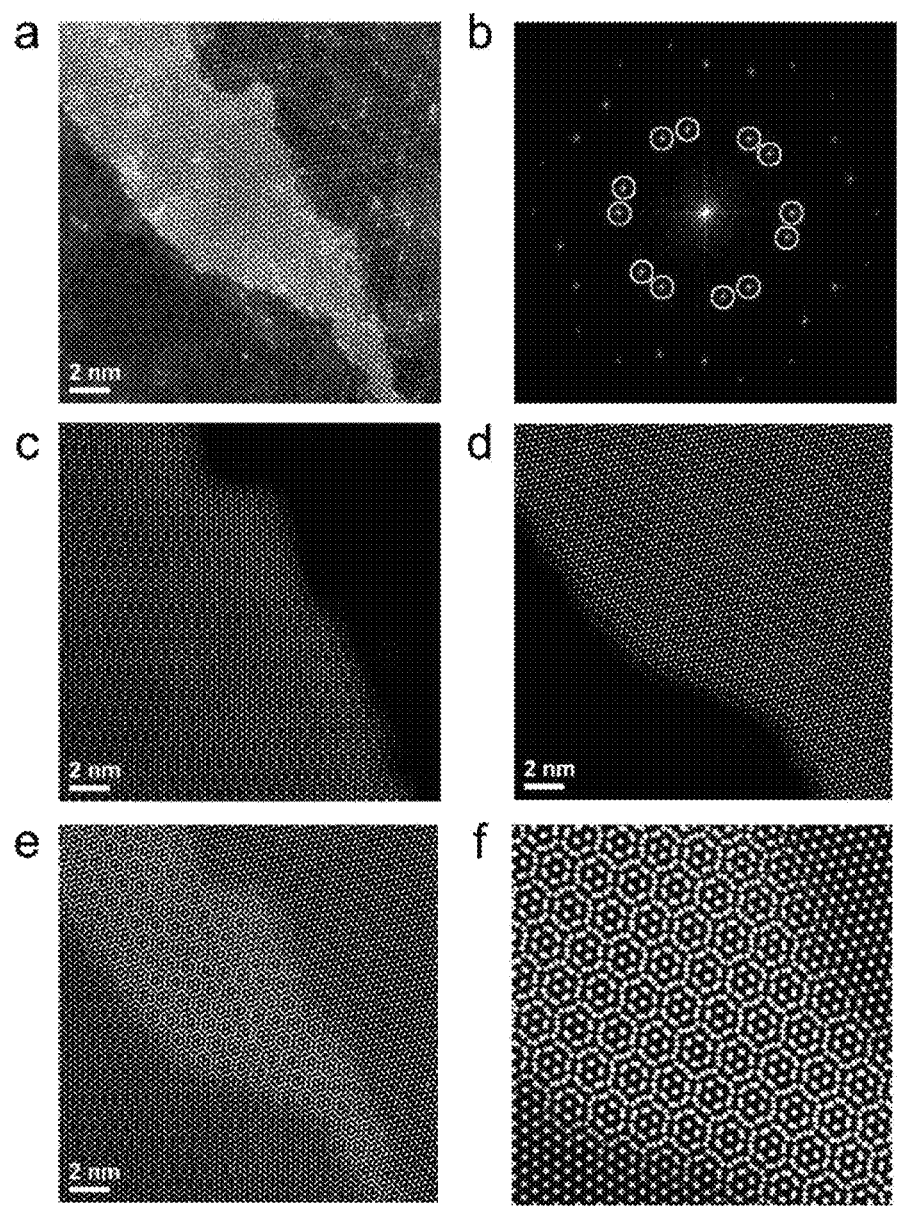
FIG. 18 shows STEM-ADF imaging of an overlapped junction between two monolayer $MoS_2$ grains with 17° rotation.

FIG. 15A shows an atomically-resolved STEM-ADF image from a grain boundary with ~21° tilt angle in false colors. The darker atomic columns in FIG. 15A correspond to two S atoms on top of each other, while the brighter spots are single Mo atoms. A detailed analysis of the STEM-ADF image indicates that all dislocations at this observed grain boundary have the shortest Burgers vector (1, 0), following the same notation as Burgers vectors in graphene (FIG. 18), which strongly suggests that removing or inserting a semi-infinite stripe of atoms along the armchair direction can form these dislocations. A closer look at the regions highlighted by the light blue and red rectangles in FIG. 15A reveals the atomic configurations of the dislocation cores that are commonly observed at the $MoS_2$ grain boundaries. The Mo-oriented dislocations consist of 5|7 fold rings (FIG. 15B) and their variations, with sulfur substitutions at one of the sharing Mo sites (FIG. 15C).

Basic dislocation theory combined with DFT calculations were employed to understand the atomic structure and formation energy of the pristine and sulfur-substituted 5|7 fold rings. Due to the unique triple-layered structure of $MoS_2$, the dislocation cores extend three-dimensionally, with two layers of five-fold or seven-fold rings joining at Mo sites in the middle layer (FIGS. 15D-F). The rings are comprised of a Mo-oriented dislocation core structure formed by fifteen atoms, with two Mo atoms constituting a Mo—Mo bond shared by the 5- and 7-fold rings (FIG. 15E). In each Mo-oriented 5|7 dislocation, there are five distinct Mo sites that could be substituted by S atoms (FIG. 15E). At Mo sites 1, 4, and 5, six S—S homo-elemental bonds are introduced after $S_2$ substitution (i.e. two S atoms replacing one Mo), while the shared Mo—Mo bond in the middle remains unchanged. In contrast, for $S_2$ substitution at the middle Mo sites 2 and 3, the Mo—Mo bond is replaced by two Mo—S bonds, and only four S—S bonds are generated, making this type of $S_2$ substitution energetically favorable (FIG. 15F). In sulfur-rich conditions, the formation energies for the $S_2$ substitution at Mo sites 1-5 are 5.2, −0.8, −0.9, 1.0, and 1.5 eV, respectively. With the lowest negative formation energy, the $S_2$ substitution at Mo site 3 is the most stable among the various possible structures, consistent with experimental observations (FIG. 15C).

Figure 20:
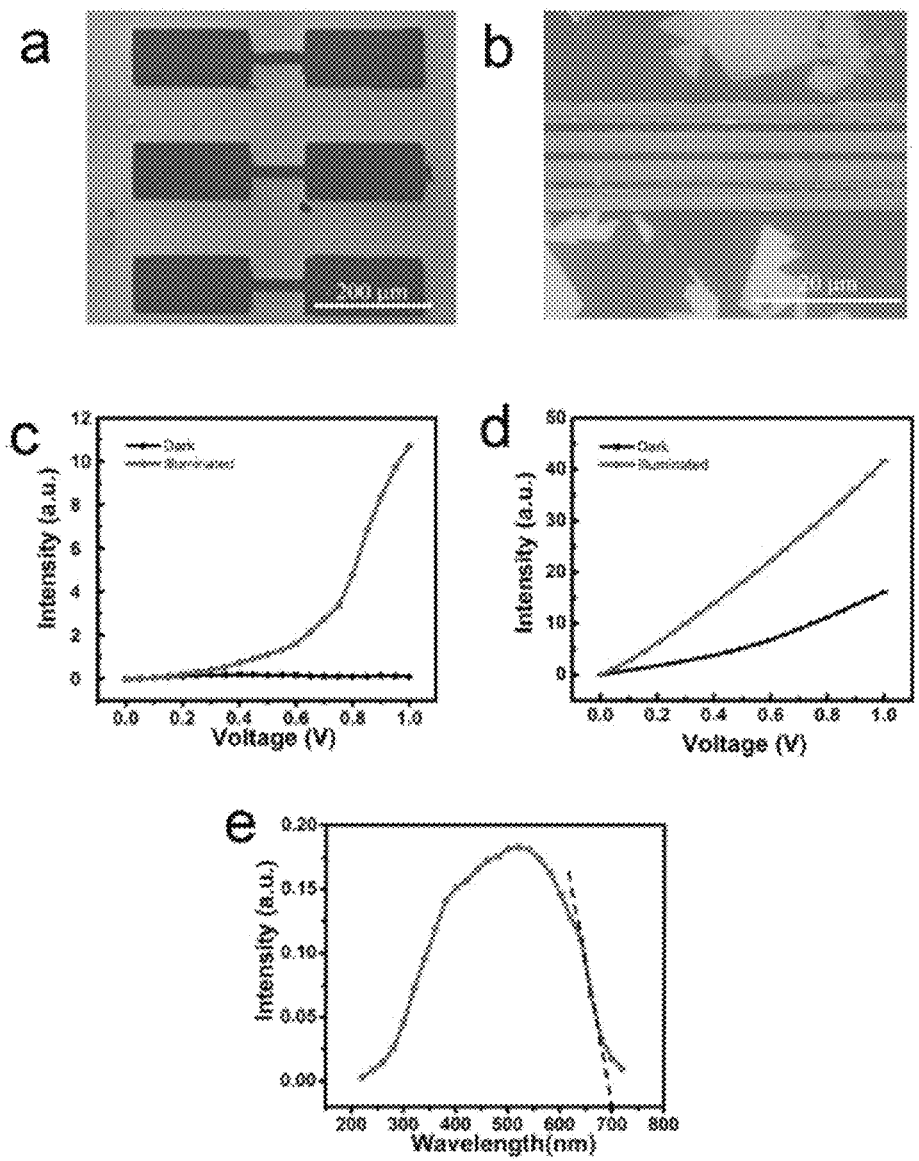
FIG. 20 shows phototransistors and photocurrent measurements.

In addition to the aforementioned traditional grain boundaries, overlapped junctions may also form when two $MoS_2$ grains merge. FIG. 15G shows a false-color DF TEM image from two grains with 30° rotation. As a result of the formation of in-plane covalent bonds, the red and green grains form grain boundaries in the upper part, while in the lower part of the junction, the two grains continue to grow on top of each other, forming a bi-layered overlapped region at the junction. A closer look at such overlapped junction (FIG. 15H) exposes the distinct Moiré pattern, which, combined with the two sets of six-fold symmetry diffraction spots (shown in the inset), corroborates the claim that only two grains are present in this region. Fourier filtering each set of diffraction spots allows the spatial extension of the grains to be mapped out (FIGS. 15I and 20). The Fourier filtering mapping suggests that the two layers continue to grow on top of each other without forming any in-plane chemical bonds. Consequently, the interaction between these grains at the overlapped junctions could be mediated by weak van der Waals forces. Moreover, FIG. 15G demonstrates that the formation of conventional grain boundaries and the overlapped junctions are competing processes, but a clear dependence on the degree of lattice orientation mismatch in the two grains was not observed in our experiments.

Figure 21:
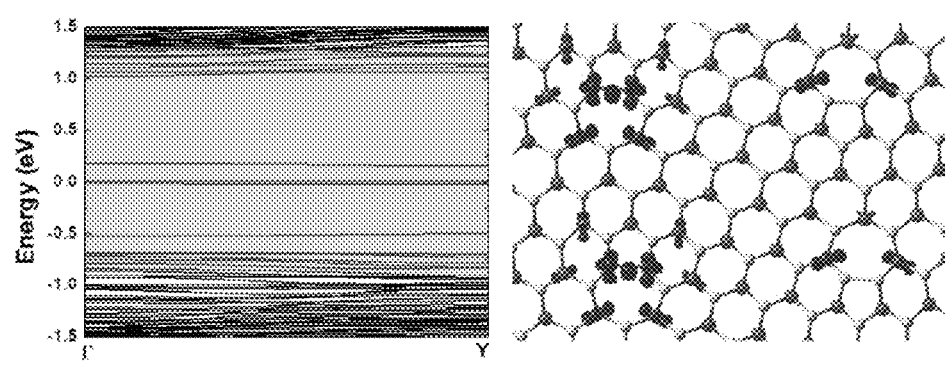
FIG. 21 shows the effect of grain boundaries on the electronic properties of $MoS_2$. In the left panel, the Fermi level is set to zero and the faded areas correspond to the localized energy bands mainly contributed by the grain boundaries. The electrons occupying these deep levels are highly localized and do not contribute to the conductivity through thermal activation. Right panel schematically shows the partial charge density distribution corresponding to the energy range −0.5 to 0.5 (eV).
Figure 22:
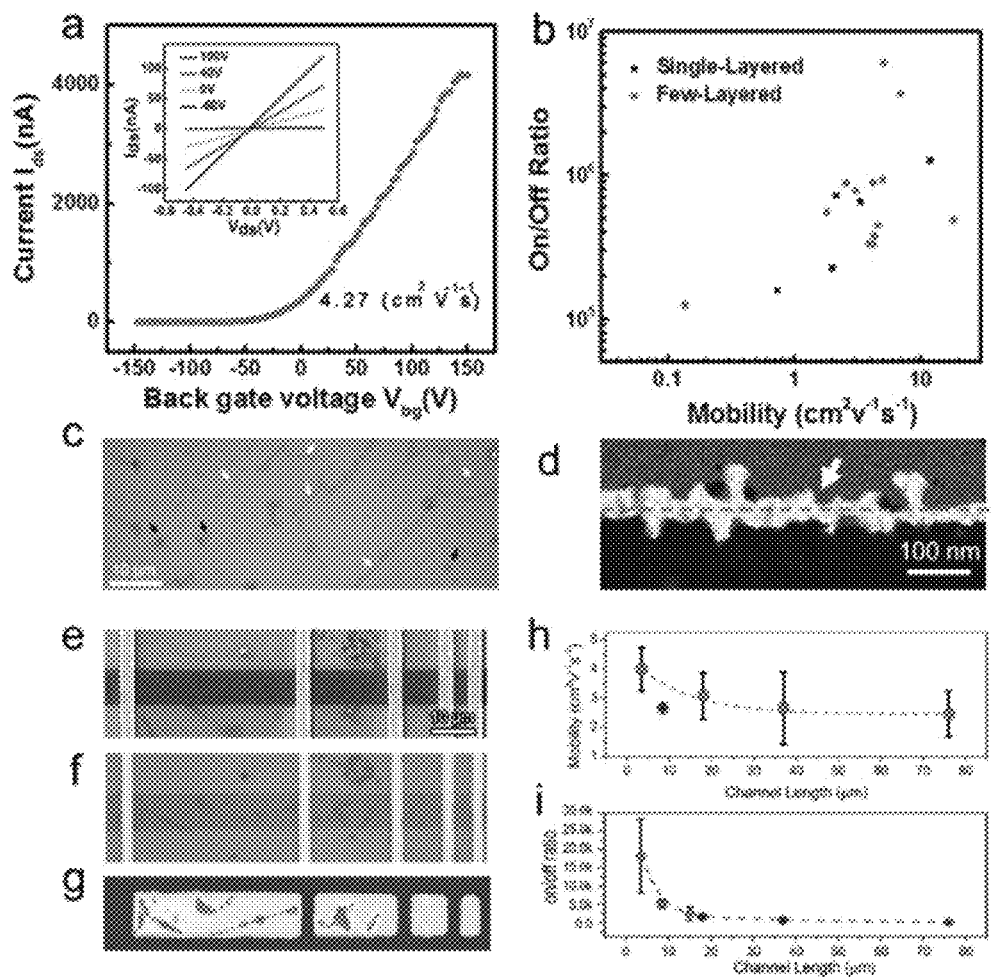
FIG. 22 shows the electrical properties and the effect of grain boundaries.
Figure 23:
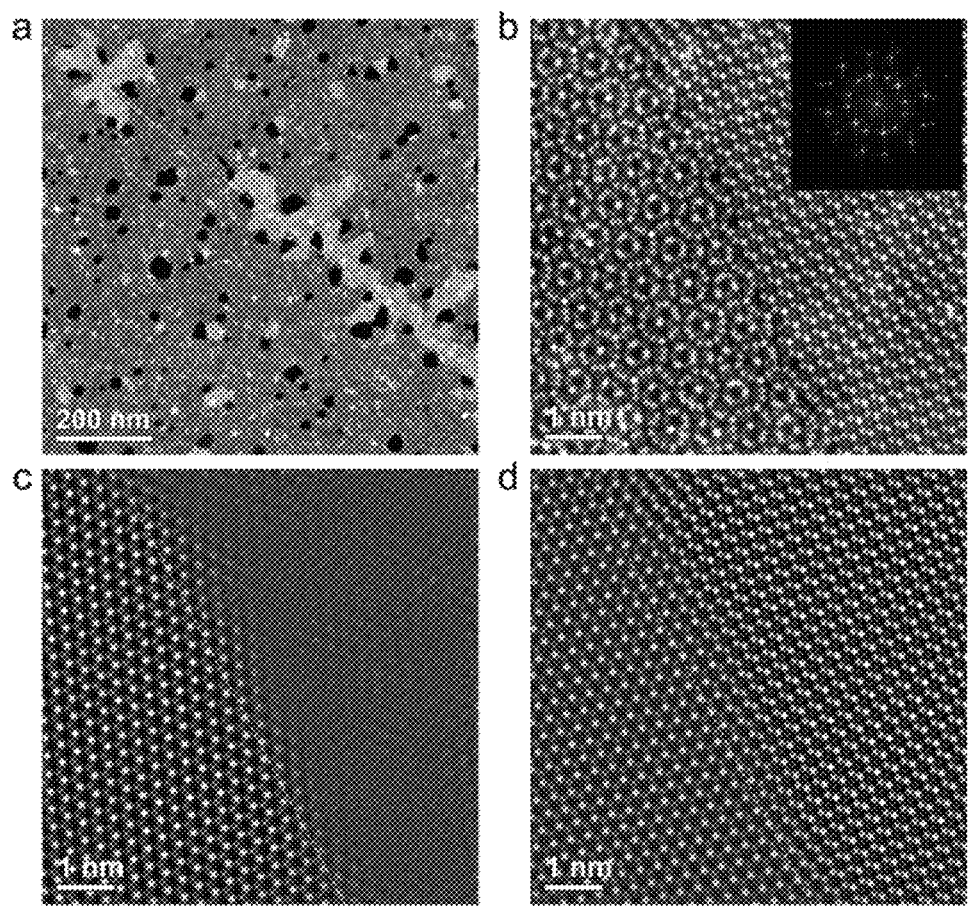
FIG. 23 shows STEM-ADF images of the second $MoS_2$ layer grown along the grain boundaries.

To evaluate the electrical performance of the materials, Applicants measured their field effect carrier mobilities. FET devices were fabricated by patterning the films using lithography and reactive ion etching (FIG. 21). These devices have a channel length and width of 100 μm and 10 μm, respectively. All devices demonstrated FET characteristics of n-type semiconductors, similar to mechanically-exfoliated samples (FIG. 22A). Mobility measurements obtained under good ohmic contact (FIG. 22A and inset) show an average of $4.3 \pm 0.8$ $cm^2 V^{-1} s^{-1}$ for the multiple devices with film thicknesses ranging from single to multiple layers (FIG. 22B), which is within the range of reported experimental values for mechanically-exfoliated samples. The measured ON/OFF ratios for the devices reach a maximum value of $6 \times 10^6$ for the gate voltage in the range of −150 to 150 V and a source-drain bias of 5 V.

In conclusion, Applicants' results in this Example demonstrate the vapor phase growth of $MoS_2$ atomic layers by nucleation, growth, and grain boundary formation of single-crystalline domains. A straightforward method for the controlled nucleation of molybdenum disulfide and large-area synthesis of films was demonstrated. The coalescence of the grains lead to the formation of grain boundaries composed of arrays of dislocations of pristine and sulfur-substituted 5|7 fold rings. Alternatively, some grains join by simply growing on top of each other without forming any chemical bonds. The high quality of the $MoS_2$ atomic layers, exemplified by their electrical performance, presents a significant step towards scalable preparation of this material.

Example 1.1

Materials and Methods

To synthesize $MoS_2$ atomic layers in a vapor phase deposition process, $MoO_3$ and pure sulfur were applied as precursor and reactant materials, respectively. Insulating $SiO_2$/Si substrates were used, and the experiments were performed at a reaction temperature of 850° C.

A scanning electron microscope (SEM, FEI Quanta 400) was used to study the morphology and the distribution of $MoS_2$ triangles and films on silica substrates. Raman spectroscopy performed on a Renishaw in Via microscope characterizes the structure and thickness of the films at 514.5 nm laser excitation. Film thickness and topographical variations in the samples were measured using Atomic force microscopy (AFM, Agilent PicoScan 5500).

Transmission electron microscopy is employed to study the morphology, crystal structure, and defects of the $MoS_2$ samples. The TEM experiments are performed on a JEOL 2100F microscope operating at 200 kV, and a FEI Titan 80-300 TEM operating at 60 kV. The diffraction patterns of individual $MoS_2$ triangles are obtained from the whole triangle using a selected-area aperture. For the large-size DF TEM image of the $MoS_2$ film (FIG. 13), 507 DF TEM images were taken at the same diffraction spot under the same microscope settings, with spacing of 3 µm for each frame, under the DF imaging mode. The images are then aligned and stitched by Microsoft Image Composite Editor. To recheck every composite, BF TEM images at low magnification are acquired (FIG. 13A). False-color DF TEM images are obtained by Red, Green, and Blue (RGB) image construction of individual DF images acquired at the DF mode by selecting the spots at each pattern set with a small objective aperture.

Figure 19:
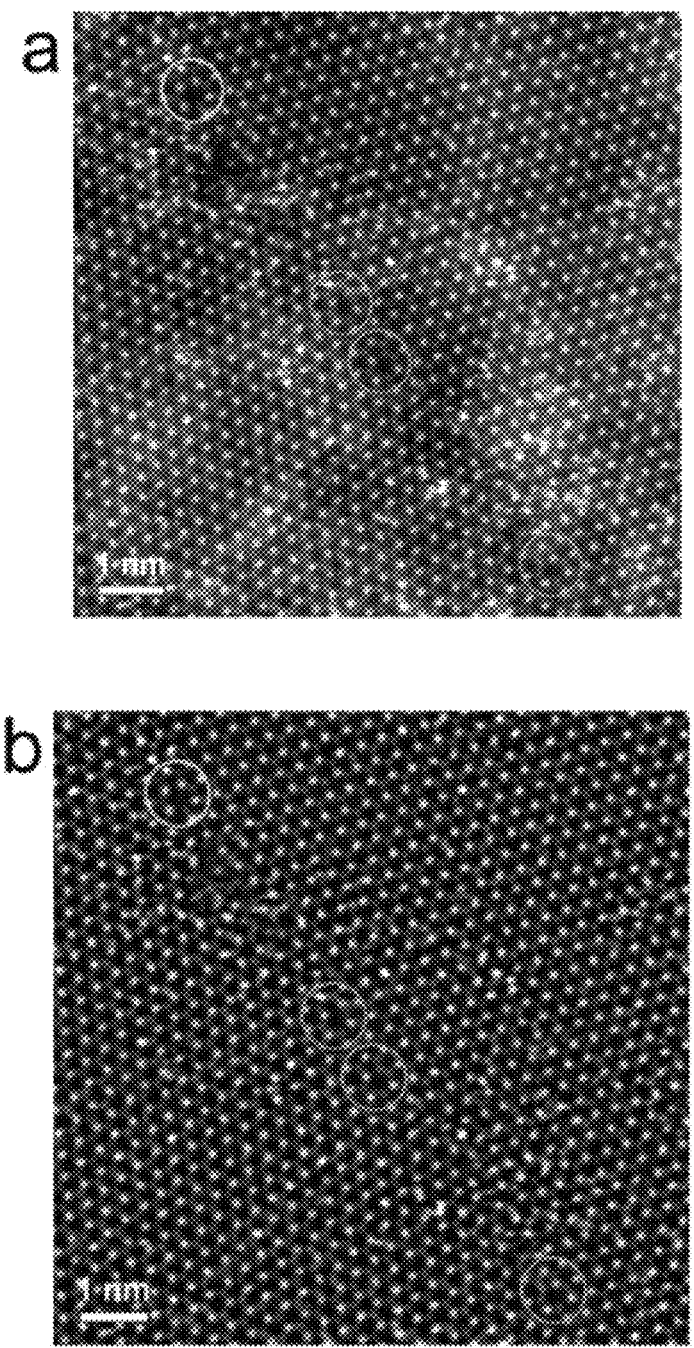
FIG. 19 shows STEM-ADF image of a grain boundary with 21° tilt angle.

Scanning transmission electron microscopy (STEM) imaging and spectroscopy analysis are performed on an aberration-corrected Nion UltraSTEM-100 operating at 60 kV. The convergence semi-angle for the incident probe is 31 mrad. Annular dark-field (ADF) images are gathered for a half-angle range of ~86-200 mrad. EEL spectra are collected using a Gatan Enfina spectrometer, with an EELS collection semi-angle of 48 mrad. The ADF images presented in this Example are low-pass filtered in order to reduce the random noise in the images. The ADF image shown in FIG. 15A is prepared by partially filtering out the direct spot in the FFT of the image. This filtering process helps to remove the contrast generated by the surface contaminations (FIG. 19).

TEM samples are prepared using a standard PMMA-based transfer, where the samples are spin-coated and submerged in basic solutions such as KOH. Subsequently, acetone and DI water are used to clean the TEM grid, allowing for the suspension of the films in the solution and the transfer to TEM grids. Applicants note that this method tends to damage the $MoS_2$ film by creating small holes, as seen in FIG. 14B. Samples for STEM analysis are prepared by placing the as-grown $MoS_2$ films onto lacey-carbon TEM grids, and immersing them into 2% HF solution for 20 seconds. Most of the $MoS_2$ films and triangles are then transferred onto the grid.

X-ray photoelectron spectroscopy (XPS, PHI Quantera) is performed using monochromatic aluminum Kα X-rays, and the obtained data is analyzed with the MultiPak software. Field effect transistor (FET) devices are made by photolithography process using photoresist S1813, mask aligner (SUSS Mask Aligner MJB4), and $O_2$ reactive ion etching (RIE, Phantom III). The photoresist is removed by acetone and PG-REMOVER. A similar lithography process is used to prepare the photoelectric devices, with the addition of the photoresist LOR5B as an adhesive layer to achieve an undercut. The electrodes (Au/Ti, 50 nm/3 nm) are deposited using the e-beam evaporator. Electrical measurements are performed in a Lakeshore probe station under vacuum conditions ($10^{-5}$ Torr), and field-effect transistor (FET) and I-V measurements are carried out using two, Keithley 2400 source meters. Applicants estimate the charge carrier mobility in these devices using the equation $\mu=[dI_{ds}/dV_{bg}]\times[(L/(WC_iV_{ds})]$, where L and W are the channel length and width. The capacitance between the channel and the back gate per unit area is estimated to be $\sim 1.2\times 10^{-4}$ $Fm^{-2}$ ($C_i=\epsilon_0\epsilon_r/d$, where $\epsilon_0=3.9$ and d=285 nm). The theoretical estimate for the capacitance of $SiO_2$ can provide a lower limit estimate for the calculated mobilities. The photoelectric measurements are performed in a home-built electrical and environmental noise-reducing chamber, using a Stanford Research SR830 Lock-in Amplifier combined with an optical chopper for signal modulation and noise filtration.

Example 1.2

$MoO_3$ Ribbon Preparation

As the precursor to $MoS_2$, $MoO_3$ films were prepared by the filtration or dispersion of their highly crystalline nanoribbons, which were produced hydrothermally through a process widely used for synthesis of this type of single-crystalline material. Sodium molybdate ($Na_2MoO_4$) or heptamolybdate tetrahydrate ($(NH_4)_6Mo_7O_{24}\cdot 4H_2O$) were used to synthesize $MoO_3$ nanoribbons. Applicants dissolved 1.2 grams of these agents in nitric acid and transferred the solution to a Teflon container, which was heated at 170° C. for 1-2 hours. These $MoO_3$ nanoribbons have a high aspect ratio, roughly 20 microns in length, 1-2 microns in width, and a thickness in the range of 10-40 nanometers (FIG. 2A).

Example 1.3

CVD Growth Process

The ribbons were then filtered or dispersed and large-area films were formed, cut into pieces, and placed on silicon substrates. This $MoO_3$-covered silicon substrate, along with several bare substrates designated for the growth of $MoS_2$, were placed close to each other at the center of the furnace vented with nitrogen at 200 sccm (FIGS. 2B-C). At the opening of the furnace, a container with 0.8-1.2 grams of sublimated sulfur was placed at a location reaching an approximate maximum temperature of 600° C. The center of the furnace was gradually heated from room temperature to 550° C. in 30 min at a rate of approximately 20° C./min. As the temperature approached 550° C., the sulfur slowly evaporated. The chamber was then heated to 850° C. at a slower pace of ~5° C./min. After 10-15 minutes at this temperature, the furnace was naturally cooled back to room temperature.

Example 1.4

Proposed $MOS_2$ Growth Dynamics: Effect of Sulfur Concentration and Pressure on the Growth Process Although the full extent of the reaction between sulfur and $MoO_3$ has not been explored, some information can be extrapolated from the extensively-studied interaction between $MoO_3$ and $H_2S$. It is known that this reaction includes a transition to the $MoO_{3-x}$ species and the subsequent formation of oxisulfides. At a suitable temperature range (200-400° C.) and sufficient reaction time, this reaction proceeds to result in a complete conversion to $MoS_2$. Without being bound by theory, it is postulated that similar stepwise transitions in vapor phase are involved in, in which $H_2S$ is substituted with sulfur as reactant. When the intermediate oxides form, they diffuse across the bare substrates and, as a result of sulfurization, initially form the triangular $MoS_2$ domains and further grow into continuous films (FIG. 2C).

The temperature dependent studies reveal the ideal temperature for the high-quality formation of these triangular flakes is in the range of 800-850° C. These results are in agreement with the previously reported experiment.

The sulfur concentration in this process at a given time of the experiment depends on the position of its container relative to the center of the furnace, the outgoing flow of gases from the chamber, and the initial loading of the sulfur. The experiments demonstrate that, in the case of an insufficient sulfur supply, oxisulfide rectangular domains nucleate and grow, instead of $MoS_2$ triangles and films (FIGS. 4A-B). As the sulfur concentration is increased to 0.5-0.7 grams, hexagonal $MoS_2$ domains nucleate. At >1 grams of sulfur, triangular domains dominate (FIGS. 4C-D).

Another parameter with very important role in the source supply and growth of $MoS_2$ that is interrelated to the sulfur concentration is the pressure. As the sulfur evaporates, the pressure increases. The outgoing flow can be adjusted to control the maximum pressure reached in the experiment which also controls the amount of sulfur in the chamber. The maximum pressure is used in the following discussion as a measure for understanding the pressure dependency of the $MoS_2$ growth. It is evident that both single-crystalline growth and density of nucleation are effected by the pressure. As the pressure increases, less $MoO_3$ is evaporated and its simultaneous solid state sulfurization slows down and ultimately stops the process. In FIG. 5, the change in the growth process is demonstrated by showing the most commonly observed features.

At close to atmospheric pressures (0.5-1 KPa), the supply of sulfur is low. However, sufficient $MoO_3$ is evaporated and typically oxisulfides or hexagonal isolated islands form (FIG. 4). Additionally, at the same pressures granular and thick films may grow (FIG. 5A). Increasing the pressure to 1-4 KPa, the growth of small triangles initiates (FIG. 5B) and it extends to large area films in the pressures range of 4-10K (FIG. 5C).

At these pressures, both supplies of $MoO_3$ and sulfur are sufficient for large area growth and coalescence of triangular domains. At slightly higher pressures, 10-40 KPa sulfur is plentiful but lower evaporation of $MoO_3$ slows down its supply. As a result, isolated but very large (e.g., 50-80 μm) triangular domains form (FIG. 14D). At higher pressures (40-80 KPa), these isolated triangles shrink in size and their morphology begins to change (FIG. 14E). At the maximum pressures that the CVD chamber can withhold (80-120 KPa), isolated star shaped islands grow (FIG. 14F).

In conclusion the sulfur concentration is the limiting factor that determines the morphology and the size of the single crystalline domains. In addition, $MoO_3$ controls the density of nucleation and large-area growth of $MoS_2$. The sulfur concentration and pressure controls provide the means to maximize the size of the single-crystalline domains, before they merge. The application of lower densities of $MoO_3$ precursors in the pattern-based nucleation and growth technique reveals that the maximum triangular domain sizes are in the order of 20-25 μm under the growth conditions. This is in agreement with the results described on the pressure dependency of the $MoS_2$ growth.

In FIG. 8A, although most triangular domains have not reached their maximum size (~20 μm), they have already made contact with triangles nucleated from other sites. Furthermore, as more precursor is provided, over-layers grow (FIG. 8B). However, for slightly larger patterns, many triangles in the maximum size range are observed and they meet other domains at relatively larger sizes (FIGS. 8C-D). Since the ratio of the edge perimeter to the total area has an inverse relationship with the size of the patterns, further pattern size increase can result in very few edge-based nucleations. Applicants conclude that sufficient density of nucleation sites as compared to the maximum size of crystalline domains can result in high level of uniformity and crystallinity in these samples.

Example 1.4

Optical Examination, Raman Measurements, XPS and EELS

The optical images of the films and the triangular domains provide a qualitative measure of the samples' thickness and uniformity (FIG. 11A). Applicants have further evaluated sample thickness and surface roughness using Raman spectroscopy. It has been shown that the two vibrational modes of $MoS_2$ tend to approach each other down to ~18-20 cm$^{-1}$ in single-layered samples, providing a robust thickness characterization tool for samples up to and including 4 layers. The measured differences between the characteristic Raman peak positions, $E_{12g}$ and $A_{1g}$—acquired from areas presented in FIG. 11A—are 19.5 and 22.2 cm$^{-1}$, corresponding to the thicknesses of one and two layers (FIG. 11B). Thickness analyses across these samples indicate that these films are mostly single-layered, with occasional two- or few-layered regions.

Raman intensity mapping has been proposed as a method for the investigation of grain boundaries in graphene. These studies showed that the D-band intensity in graphene could be utilized to detect nucleation sites and grain boundaries. In the present Example, the Raman intensity mapping for characteristic band positions of single-layered samples ($E_{12g}$ (385 cm$^{-1}$) and $A_{1g}$ (405 cm$^{-1}$), from the merged triangles are collected. These results reiterate the thickness uniformity of these samples (FIGS. 11C-D). In these maps, the nucleation sites are clearly discernable. However, no clear indications of changes in the vibrational properties are observed at likely grain boundaries.

XPS measurements at every stage of the growth process, from the triangular domains to continuous films, provide strong evidence for the high-quality formation of $MoS_2$, as presented in FIGS. 12A-B. The information acquired from the position and intensity of the Mo 3d and S 2p bands on dispersed triangles, discontinuous films, and completed films demonstrate that the bonds in $MoS_2$ samples at every stage are fully formed. In these samples, the single molybdenum doublet Mo $3d_{3/2}$ and Mo $3d_{5/2}$ appear at binding energies of 233.9 eV and 230.9 eV, respectively. Likewise, the sulfur doublets S $2p_{1/2}$ and S $2p_{3/2}$ appear at 162.9 eV and 161.8 eV, respectively.

These measurements match the characteristic band positions of fully-transformed $MoS_2$ during the sulfurization of $MoO_3$, validating its complete conversion during the growth process. Moreover, electron energy-loss spectroscopy (EELS) obtained from clean regions in the $MoS_2$ domains shows only the characteristic peaks of Mo (M-edge) and S (L-edge) without impurities (FIG. 12C), which further confirms these findings.

Example 1.5

Density Functional Calculations

The total energy first-principles calculations are performed using density functional theory (DFT) within the local density approximation (LDA) and the projector-augmented wave (PAW) method, as implemented in Vienna Ab-initio Simulation Package (VASP). The grain boundaries (GBs) are modeled with similar tilt angle (~21°) as those in the experiment. The periodic models incorporate oppositelyaligned Mo-oriented 5|7 in a large supercell. The in-plane lattice parameters are roughly 34 Å and 11 Å in the perpendicular direction and along the GBs, respectively. Between the layers, a vacuum layer of 12 Å is introduced. In all structures, a plane-wave-based total energy minimization scheme-1×3×1 Monkhorst-Pack k-point mesh centered at the Γ-point with an energy cutoff of 280 eV is applied until the force on each atom is less than 0.01 eV/Å.

Formation energies for $S_2$ substitution are defined by the following formula:

$$E_f = E_{S2\text{-}sub} - E_{Mo-5|7} - \sum_i \Delta n_i \mu_i$$

In this formula, $E_{S2\text{-}sub}$ and $E_{mo-5|7}$ are the total energies of $S_2$-substituted and un-substituted Mo-oriented 5|7s within similarly-sized supercells, respectively. $\Delta n_i$ and $\mu_i$ are the change in the number of atoms and the chemical potentials of species i, for Mo or S. In thermodynamic equilibrium with the $MoS_2$, $\mu_{Mo}$ and $\mu_s$ satisfy the equation $g_{MoS2} = \mu_{Mo} + \mu_s$, where $g_{MoS2}$ is the Gibbs free energy of an infinite $MoS_2$ sheet per unit molecule. The formation energies are calculated under the S-rich condition, taking chemical potential of the bulk-S as reference.

Example 1.6

Optical Devices for Opto-electrical Characterization of $MoS_2$

To demonstrate the optical properties and device performance of the $MoS_2$ films, photolithography was used to prepare electrodes on these samples for photocurrent measurements (FIG. 20B). Applicants measured the voltage dependence of the devices' photoelectric response and calculated an ON/OFF ratio of ~10 and ~3 for single- and multi-layered devices, respectively (FIGS. 20C-D). These results highlight a significant enhancement in the photocurrent response and photosensitivity of the single-layered, as compared to the multi-layered samples. Applicants also measured the wavelength dependence of the photo-current for wavelengths ranging from 750 down to 200 nm (FIG. 20E). The experiments reveal photocurrent properties similar to those observed in single-layered and bulk samples. As shown in FIG. 20E, the photocurrent signal drastically increases as the wavelength decreases to around 700 nm, corresponding to the absorption energy edge (~1.8 eV) of single-layered $MoS_2$.

Example 2

Band Gap Engineering and Layer-by-Layer Mapping of Selenium-doped Molybdenum Disulfide Ternary two-dimensional dichalcogenide alloys exhibit compositionally modulated electronic structures. Hence, control of dopant concentration within each individual layer of these compounds provides a powerful tool to efficiently modify their physical and chemical properties. The main challenge arises when quantifying and locating the dopant atoms within each layer in order to better understand and fine-tune the desired properties.

In this Example, Applicants report the synthesis of molybdenum disulfide substitutionally doped with a broad range of selenium concentrations, resulting in over 10% band gap modulations in atomic layers. Chemical analysis using Z-contrast imaging provides direct maps of the dopant atom distribution in individual $MoS_2$ layers and hence a measure of the local band gaps. Furthermore, in a bilayer structure, the dopant distribution is imaged layer-by-layer. This Example demonstrates that each layer in the bilayer system contains similar doping levels, randomly distributed, providing new insights into the growth mechanism and alloying behavior in two-dimensional dichalcogenide atomic layers. The results show that growth of uniform, ternary, two-dimensional dichalcogenide alloy films with tunable electronic properties is feasible.

More specifically, Applicants report in this Example a one-step direct synthesis of $MoS_{2(1-x)}Se_{2x}$ atomic mono- and bi-layers with tunable doping level on $SiO_2$ by CVD. Both isolated triangular single-crystal islands as well as continuous films could be grown by controlling the growth parameters. Applicants demonstrate that, through controlled selenium doping, the band structure of $MoS_2$ could be modified and it could be continuously tuned by over 200 meV. Using atomic resolution Z-contrast imaging, Applicants demonstrate direct atomic identification of Se dopants within the $MoS_2$ lattice with almost 100% detection efficiency. Furthermore, by combining a novel site separation method and quantitative image intensity analysis, for the first time, Applicants have achieved layer-by-layer visualization and quantification of the dopant distribution, and hence been able to assign the local band gap, in this 2D-vdW alloyed system at the single-atom level and with sub-nm depth resolution. Applicants' layer-by-layer quantitative dopant analysis reveals that the two Se-doped $MoS_2$ layers at AB stacking bilayer regions probably grow simultaneously, as opposed to the sequential growth observed for bilayer graphene.

Figure 24:
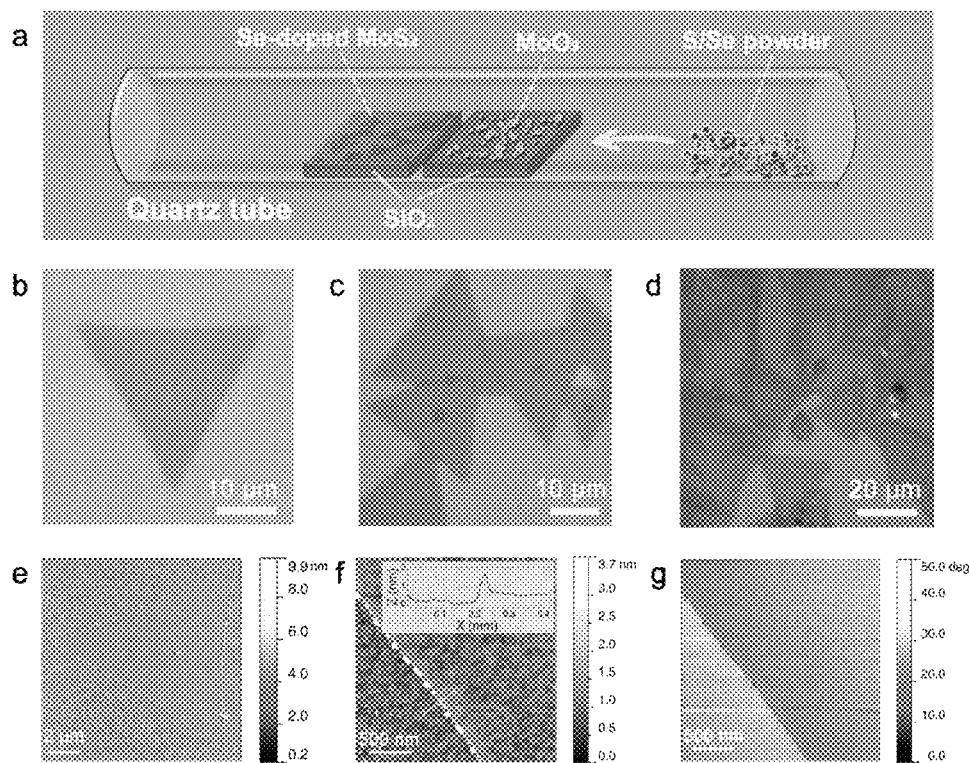
FIG. 24 provides data, images and schemes relating to the synthesis and morphologies of $MoS_{2(1-x)}Se_{2x}$ atomic layers.

In order to synthesize atomic layered $MoS_{2(1-x)}Se_{2x}$, sulfur and selenium fine powder are mixed as the chalcogen sources (S and Se), while molybdenum oxide powder is used as the Mo source. Monolayer and bi-layer $MoS_{2(1-x)}Se_{2x}$ are directly grown on $SiO_2$ via CVD at ~800° C. (FIG. 24A). The as-prepared samples with a variety of morphologies are depicted in FIGS. 24B-D. By prolonging the growing time, nucleation of a high density of domains results in merged triangles and continuous films (FIGS. 24C-D). The $MoS_{2(1-x)}Se_{2x}$ nucleation sites are noticeable in some triangles, and some bilayer regions are also found (dark purple in FIG. 24D), similar to what has been observed in the growth of pristine $MoS_2$. The size of the as-prepared single-crystal domains and continuous films is of the order of a few tens (FIGS. 24B-C) to hundreds of microns (FIG. 24D), respectively. Atomic force microscopy (AFM) height topography confirms that most of the $MoS_{2(1-x)}Se_{2x}$ films are single-layered (FIGS. 24E and 24G).

Figure 25:
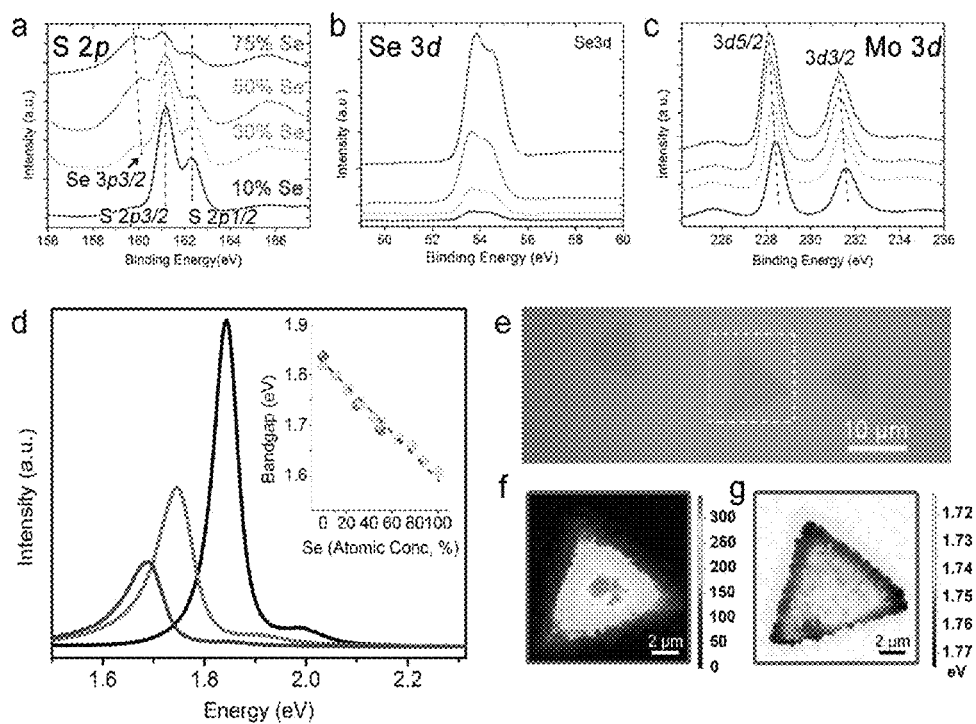
FIG. 25 shows results relating to the bandgap engineering of $MoS_{2(1-x)}Se_{2x}$ atomic layers.

By changing the ratio of the S and Se powders during synthesis, the concentration of Se in the $MoS_2$ lattice can be well controlled from 0 to ~75%, as confirmed by X-ray photoelectron spectroscopy (XPS) analysis. FIGS. 25A-C plot the S 2p, Se 1s and Mo 3d spectra for $MoS_{2(1-x)}Se_{2x}$ samples with 10%, 30%, 50% and 75% Se doping. With increasing Se concentration, the intensity of S 2p peaks (~162.3 and 161.2 eV) decrease while peaks from Se $3p_{3/2}$ (~159.8 eV) and Se 3d (~54 eV, FIG. 25B) appear and become dominant. The peaks of Mo $3d_{3/2}$ and $3d_{5/2}$ core levels are located at ~231.5 eV and 228.3 eV, respectively, in agreement with values from $MoS_2$ and $MoSe_2$ systems.

Next, Applicants used photoluminescence (PL) spectroscopy to examine the band gap modification in $MoS_2$ as a function of Se doping. FIG. 25D shows PL spectra of monolayered pristine $MoS_2$ (black), 30% Se doped $MoS_2$ ($MoS_{1.4}Se_{0.6}$, red) and 50% Se doped $MoS_2$ ($MoS_1Se_1$, blue). Only one dominant peak is observed in the spectra from Se-doped samples, suggesting that there is no separation of doped- and undoped-$MoS_2$ domains in the sample within the size of the optical probe (~500 nm). As the Se concentration increases, a noticeable red-shift in the peak position from 670 nm to 740 nm is observed, corresponding to an optical gap change from 1.85 eV to 1.68 eV. This correlation is plotted as an inset in FIG. 25D, where the Se concentration dependence of the optical gap (red dots) can be linearly extrapolated to pure $MoSe_2$ (100% Se) with a bandgap of ~1.60 eV. In the same figure, Applicants show the theoretical band edge, obtained using local density approximation (LDA), as a function of concentration (green dots). This obeys the same trend (the experimental peak is excitonic in character; the true band edge is 0.6 eV higher than the LDA gap, which represents the exciton binding energy). Additionally, for high concentrations of Se in $MoS_2$, the PL intensity decreases, possibly due to the increased local electronic states within the samples, as predicted by density-functional theory (DFT) calculations. An optical image and the corresponding PL intensity and peak position mapping of a typical $MoS_{2(1-x)}Se_{2x}$ triangle are shown in FIGS. 25E-G, respectively. It can be clearly observed from FIG. 25G that, at a given Se concentration, the bandgap of $MoS_{2(1-x)}Se_{2x}$ varies slightly (typically ~30 meV) at the micrometer scale, thus suggesting the presence of some compositional fluctuations within the $MoS_{2(1-x)}Se_{2x}$ sample. The $MoS_{2(1-x)}Se_{2x}$ alloy is also characterized by Raman spectroscopy. The vibration modes from both $MoS_2$ and $MoSe_2$ can be identified. In addition, measurements suggest that $MoS_{2(1-x)}Se_{2x}$ based field-effect transistors (FETs) have a comparable mobility (3.8 to 15.3 $cm^2/Vs$) and ON/OFF ratio ($10^6$) to high-quality $MoS_2$ FET devices.

In order to quantify the local doping-level at the nm-scale and map out the atomic distribution of Se dopants, Applicants performed atomic annular dark field (ADF) imaging, also known as Z-contrast imaging, on an aberration-corrected scanning transmission electron microscope (STEM), operating at 60 kV. ADF imaging has demonstrated to be an efficient way for atom-by-atom chemical analysis in monolayer materials, since the image intensity is directly related to the atomic number of the imaged species.

Figure 26:
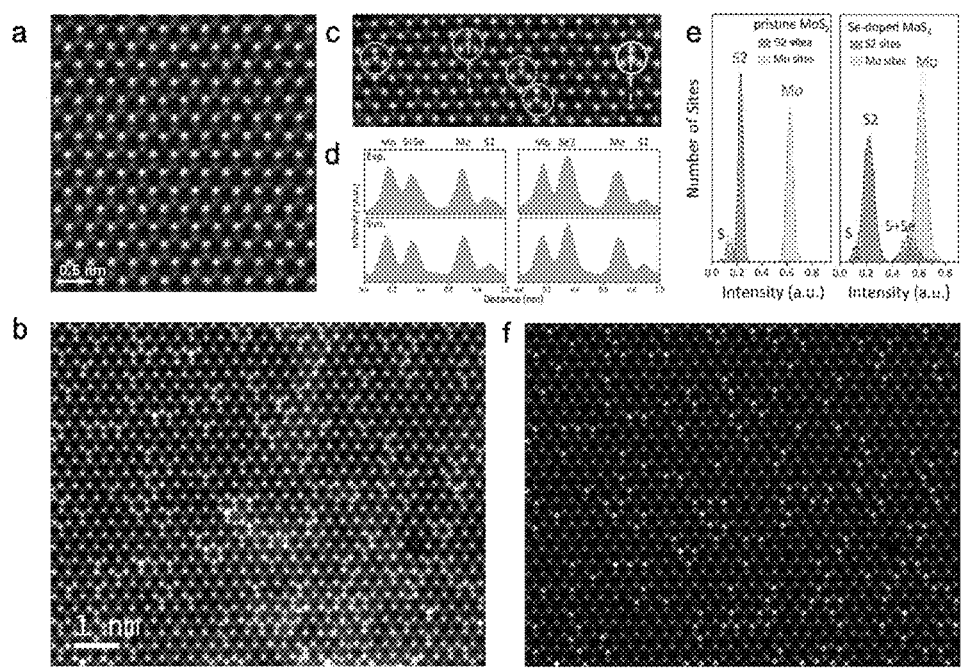
FIG. 26 shows atom-by-atom dopant analysis in monolayer $MoS_2$.

FIGS. 26A-B compare ADF images from monolayered pristine $MoS_2$ and Se-doped $MoS_2$ with about 12% local doping level. The ADF image from pristine $MoS_2$ (FIG. 26A) shows an alternating atomic arrangement of Mo and $S_2$ sites in the hexagonal lattice, with Mo atoms being brighter than the $S_2$ sites. In contrast, with Se dopants, some "$S_2$" sites become much brighter and display intensities close to or even higher than the Mo sites (FIGS. 26B-C), while the intensities of the Mo sites remains unchanged. Quantitative image intensity analysis and image simulations (FIG. 26D) demonstrate that the higher image intensity at the $S_2$ sites arises from Se substitution. $S_2$ sites with single Se substitution (i.e. Se+S, highlighted in green in FIG. 26C) have image intensity slightly lower than that of a single Mo atom, while double substitution sites (i.e. $Se_2$, highlighted in cyan in FIG. 26C) are brighter than Mo. Statistics of the image intensity from Mo and $S_2$ sites are provided in FIG. 26E.

In order to examine the doping at the different sites, here the Mo and $S_2$ sites are analyzed separately. The histogram from pristine $MoS_2$ (left panel in FIG. 26E) shows only one intensity peak for the Mo sites and one main peak for the $S_2$ sites with a small tail at half-intensity arising from $S_2$ sites with mono-sulfur vacancies. The histogram from Se-doped $MoS_2$ (right panel in FIG. 26E), however, shows an additional peak for the $S_2$ sites with single Se substitution, at about the same brightness as the Mo intensity peak, with a few double Se substitution sites displaying higher intensity than Mo. No change is observed for the image intensity distribution at the Mo sites, suggesting that Se substitution only happens at S sites.

Since the image intensities for $S_2$, Se+S, and $Se_2$ sites are well separated in the histogram after site-separation, the distribution of these three types of sites can be easily mapped out by selecting different ranges of image intensity in the histogram. This provides a quick and reliable way to perform Se dopant mapping at a relatively large scale (64-1000 $nm^2$ field of view per image) at the single-atom level in a largely automatic fashion. The output of such an analysis based on the ADF image shown in FIG. 26B is provided in FIG. 26F, where the single Se substitution and double substitution sites are presented in bright green and white, respectively. The local Se doping level, and thus the local band gap based on the linear dependency shown in FIG. 25D, at the nm scale, could then be calculated directly from the number of substitution sites.

In order to understand the growth mechanism and properties, it is of particular importance to obtain the Se distributions in each $MoS_2$ layer in the bilayer regions in the CVD-grown sample. For example, a material in which subsequent atomic layers have different doping concentrations might have very different properties from an alloy of equivalent layers. Atom-by-atom chemical analysis via quantitative ADF imaging, however, is very challenging for samples thicker than a monolayer, due to the overlap of atoms in different layers.

Figure 27:
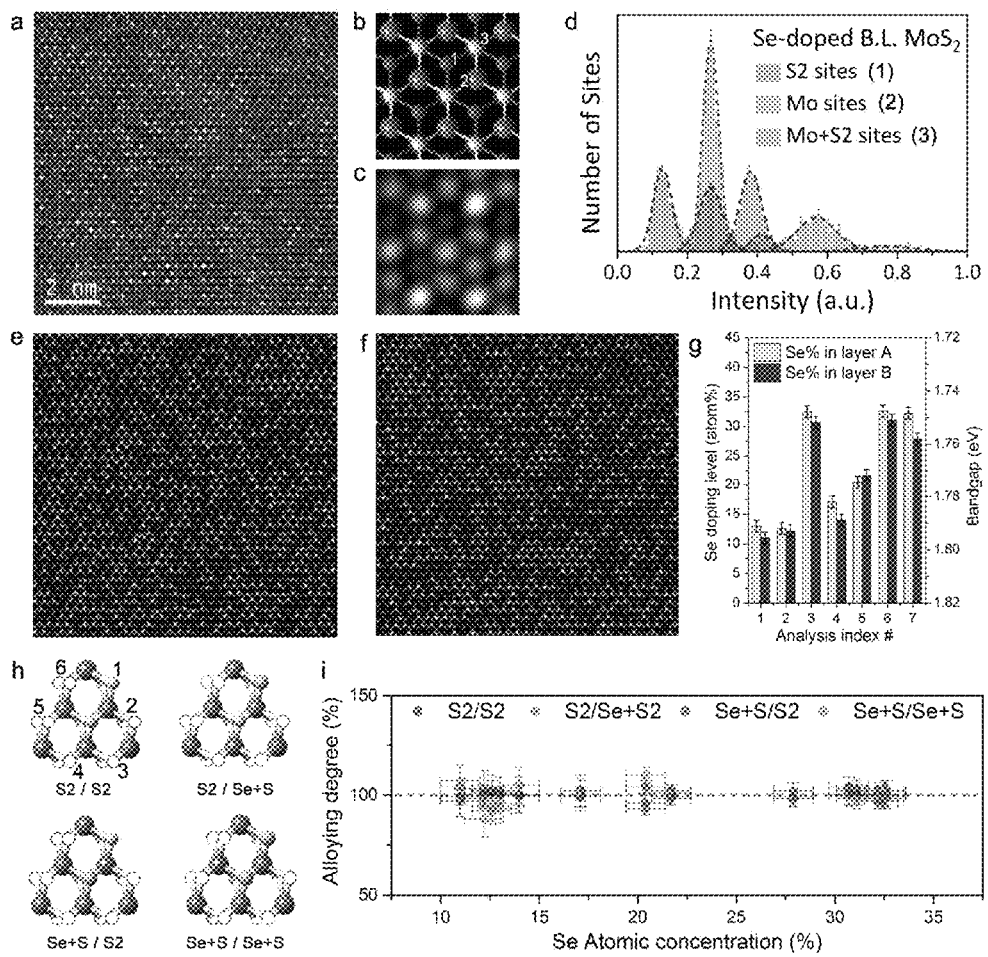
FIG. 27 shows layer-by-layer dopant analysis in AB stacked bilayer $MoS_2$ at the single atom level.

An example of a Se-doped $MoS_2$ bilayer is shown in FIG. 27A, where diverse levels of image contrast can be observed at the atomic sites, thus making the image difficult to interpret visually. Applicants notice that the bilayer regions in CVD-grown $MoS_{2(1-x)}Se_{2x}$ are predominantly AB stacking (FIGS. 27B-C), which can be separated into three distinct types of atomic sites: $S_2$ sites in the A layer, Mo sites in the B layer, and Mo in the A layer plus $S_2$ sites in the B layer (labeled as sites 1, 2, and 3 in FIG. 27B), where we use "A" and "B" as relative notations. With this site separation, the $S_2$ sites in the A and B layers can be distinguished and analyzed individually. The site-separated histogram obtained from FIG. 27A is shown in FIG. 27D. Three intensity peaks were observed for both site 1 and site 3, corresponding to $S_2$, Se+S and $Se_2$, respectively, at the dichalcogen sites in each layer. By selectively considering each intensity peak for site 1 and site 3, the distribution of these three types of dichalcogen sites in the two $MoS_2$ layers can be mapped out individually. The outputs of this layer-by-layer site-separated dopant analysis are shown in FIG. 27E-F, where the atomic positions of site 3 represent Mo sites in the A layer, and the atomic positions of site 2 are Mo sites in the B layer. The in-layer local doping level can then be quantified from these two outputs.

FIG. 27G summarizes the local Se doping level and the corresponding band gap in the A and B layers in seven random bilayer regions, usually with an area of ~10×10 $nm^2$ and ~50-200 nm apart, in the same film. It is important to note that, at random bilayer regions, the difference of the local doping level at each layer is relatively small (green and blue columns in FIG. 27G), with a mean variation of ~2%. In contrast, the local doping level can change as much as 19% between different regions within the same sample. This compositional variation is consistent with observations from PL mapping (FIG. 25G) and Raman mapping. However, the spatial resolution obtained from direct ADF imaging is on the 10 nm level, much higher than with the PL mapping. The fluctuating flow rate of Se vapor evaporated from the Se powder may be responsible for the variation of the local doping level. Furthermore, calculations show that Se diffusion between MoS$_2$ layers is orders of magnitude lower than diffusion within the same layer. Therefore, the small inter-layer compositional variation, as compared to the large inter-regional variations, suggests that the two Se-doped MoS$_2$ layers at the bilayer regions most likely grow simultaneously, instead of sequentially, i.e. under similar transient growth conditions, indicating the possibilities of layer-controlled growth of ternary two-dimensional alloys.

Using this site separation and quantitative image intensity analysis method, layer-by-layer quantification of dopant distribution can be achieved in bilayer 2D materials for the first time with single atom sensitivity and sub-nm depth resolution, which is a significant improvement as compared with methods such as depth-sectioning or tilt-tomography, which would be difficult to apply to large-size 2D materials. The accuracy of this analytical method is estimated to be about 1-2%, which compares favorably to conventional chemical analysis methods such as X-ray energy dispersive spectroscopy (XEDS), and electron energy-loss spectroscopy (EELS), at this scale. Moreover, by analyzing the site-separated image histogram, several thousand atoms can be identified in a single analysis from a single ADF image, which makes it a very dose-efficient way of performing atom-by-atom chemical analysis compared to those techniques. Thus, it is particularly suitable for high-spatial-resolution chemical analysis of electron beam sensitive 2D materials.

In addition, Applicants' method provides new insights into the alloying behavior at the single atom level. Table 1 summarizes the number of S$_2$ sites with single- and double-Se substitution obtained from the histogram analysis, compared with a binomial distribution.

TABLE 1

Comparison of the percentages of S$_2$ sites with single- and double-Se substitution obtained from experimental data and calculated based on a binomial distribution at the same local doping level.

| Image index | | S$_2$ sites (%) | Se + S sites (%) | Se$_2$ sites (%) | Se doping level (%) |
|---|---|---|---|---|---|
| FIG. 26F | Experiment | 77.5 | 20.7 | 1.8 | 12.2 |
|  | Binomial | 77.1 | 21.4 | 1.5 | — |
| FIG. 27E | Experiment | 45.8 | 44.0 | 10.2 | 32.2 |
|  | Binomial | 46.0 | 43.7 | 10.4 | — |
| FIG. 27F | Experiment | 51.8 | 40.6 | 7.6 | 27.9 |
|  | Binomial | 52.0 | 40.2 | 7.8 | — |

The numbers of single- and double-Se substitution sites observed in the sample are close to what could be expected from a binomial distribution, suggesting that there is no strong preference for forming any particular Se and S configuration in nearest neighbor chalcogen sites. This observation is consistent with theoretical calculations. The degree of alloying could also be determined directly from the outputs shown in FIG. 26F and FIGS. 27E-F, after counting the numbers of S and Se occupying the six nearest neighbor sites for all dichalcogen sites in each MoS$_2$ layer (FIG. 27H). Following a modified method, the degree of alloying ($J_{A\_B}$) is quantified as:

$$J_{A\_B} = P_{observed}/P_{random} \times 100\%$$

In this formula, $P_{observed}$ is the averaged percentage of B-type nearest neighbors for the A-type sites, and $P_{random}$ is the total percentage of B-type sites in the examined layer. The results are summarized in FIG. 27I for local Se doping levels ranging from 10% to 33%. All the J values are close to 100%. Statistical errors of the distributions of Se-doped sites may be random. Furthermore, there may be no preference for Se dopants to cluster in the MoS$_2$ layer.

In summary, Applicants have demonstrated a novel approach for preparing Se-doped MoS$_2$ atomic layers with controllable doping level using chemical vapor deposition. Applicants show that the bandgap of the material could be fine-tuned between 1.85 and 1.60 eV by changing the Se doping level. The optimal transport properties and control over the band structure of the material paves the way for future investigation of physical properties and applications of MoS$_{2(1-x)}$Se$_{2x}$ ternary systems. A novel and robust ADF-imaging-based histogram analysis method has been developed for single layer and bilayer materials to map the distribution of dopants with single-atom resolution and single layer discrimination. Quantification shows that the substitutional Se doping of MoS$_2$ is random and homogeneous at the nanoscale. This method could also be applied to other two-dimensional systems.

Example 2.1

Synthesis of Se Doped MoS$_2$

In order to synthesize MoS$_{2(1-x)}$Se$_{2x}$, Applicants adapted a technique developed for the synthesis of MoS$_2$ and WS$_2$ and used a mixture of sublimated sulfur and selenium powders. Applicants positioned the chalcogen precursors upstream in the low temperature zone of the furnace. Molybdenum oxide (MoO$_3$) powder was used as a precursor for molybdenum and was positioned on a SiO$_2$/Si wafer close to the designated growth substrate (also SiO$_2$/Si) and in the center of the reactor, i.e. the hot zone (FIG. 24A). Using a slow heating ramp of 40° C./min, the system was brought to the reaction temperature of ca. 800° C. The S and Se sources start evaporating and reacting with MoO$_3$. These experiments were performed in an inert quartz environment facilitated by a steady 100 sccm flow of Ar. The ratio between Se and S was adjusted by changing the weight of Se and S.

Example 2.2

Bandgap and Diffusion Barrier Calculations

Calculations were performed using the plane wave code CASTEP, as implemented in the Materials Studio, on 3×3 hexagonal cells under the Local Density Approximation (LDA), considering the Ceperly-Alder-Perdew and Zunger (CA-PZ) functional with 6×6×3 Monkhorst-Pack K-points and a plane waves cut off of 600 eV. All the structures were relaxed, including the cells, until the forces became smaller than 0.01 eV/Å and the energy tolerances were less than 5×10$^{-6}$ eV/atom. The intra-layer and inter-layer diffusion barrier of the Se atoms in the MoS$_2$ lattice were calculated using the nudged elastic band (NEB) method implemented in the VASP package with dispersion-corrected (van der Waals) functional, on 12×12 hexagonal cells and 6×6 hexagonal bilayer cells.

Example 2.3

Analysis of Dopant Distribution from STEM-ADF Images

In order to determine the positions and types of the atoms, Applicants used a method based on an initial indication of the number of unit cells, their approximate positions and atom locations within a unit cell, which are then refined in an iterative manner. For each iteration, the center $(x_j,y_j)$ of the intensity (I) for the j'th atomic column was calculated as $(x_j,y_j)=(\Sigma_i I_{ij}x_{ij},\Sigma_i I_{ij}y_{ij})/\Sigma_i I_{ij}$, where the denominator is the summed intensity, and the sums over i include all pixels within a user-defined radius of the center from the previous step.

This process gives a sub-pixel estimate of the column position and since the intensity is averaged over several pixels, it is less sensitive to noise than taking a single pixel maximum. This procedure was typically iterated for about 20 steps and the convergence monitored. After the process, atomic columns that were too far from the initial estimate were treated as potentially unreliable. The histograms were plotted, and the intensity values at which the columns are assigned as $S_2$, S+Se, or $Se_2$ for site 1 (or Mo plus $S_2$, S+Se, or $Se_2$ for site 3) can be specified. Although the peaks in the histogram are distinctly separated, there could be some overlap between them and the area of this overlap can be used to give an indication of the error in the assignment of the dopants.

Without further elaboration, it is believed that one skilled in the art can, using the description herein, utilize the present disclosure to its fullest extent. The embodiments described herein are to be construed as illustrative and not as constraining the remainder of the disclosure in any way whatsoever. While the embodiments have been shown and described, many variations and modifications thereof can be made by one skilled in the art without departing from the spirit and teachings of the invention. Accordingly, the scope of protection is not limited by the description set out above, but is only limited by the claims, including all equivalents of the subject matter of the claims. The disclosures of all patents, patent applications and publications cited herein are hereby incorporated herein by reference, to the extent that they provide procedural or other details consistent with and supplementary to those set forth herein.

What is claimed is:

1. A method of growing a chalcogen-linked metallic film on a surface in a chamber, said method comprising:
   (a) patterning the surface to form a pattern on the surface, wherein the pattern comprises edges;
   (b) placing a metal source, a chalcogen source, and the surface in the chamber; and
   (c) heating the chamber,
      wherein the heating leads to the deposition of the chalcogen source and the metal source onto the surface,
      wherein the heating facilitates growth of the chalcogen-linked metallic film from the chalcogen source and the metal source on the surface, and
      wherein the growth of the chalcogen-linked metallic film follows the edges of the pattern.

2. The method of claim 1, wherein the surface is a silicon wafer.

3. The method of claim 1, wherein the surface is coated with silicon-oxide.

4. The method of claim 1, wherein the patterning of the surface occurs by photolithography.

5. The method of claim 1, wherein the chalcogen source is selected from the group consisting of oxygen, sulfur, selenium, tellurium, and combinations thereof.

6. The method of claim 1, wherein the chalcogen source comprises sulfur.

7. The method of claim 1, wherein the chalcogen source comprises sulfur and selenium.

8. The method of claim 1, wherein the metal source is selected from the group consisting of metals, metal oxides, transition metals, transition metal oxides, and combinations thereof.

9. The method of claim 1, wherein the metal source is selected from the group consisting of molybdenum, tungsten, titanium, and combinations thereof.

10. The method of claim 1, wherein the metal source is molybdenum trioxide.

11. The method of claim 1, wherein the chalcogen source and the metal source are deposited onto the surface by chemical vapor deposition.

12. The method of claim 1, wherein the heating of the chamber occurs by heating the chamber to about 850° C.

13. The method of claim 1, wherein the heating of the chamber occurs by heating the chamber at a rate of between about 1° C. per minute to about 50° C. per minute.

14. The method of claim 1, wherein the heating of the chamber occurs by:
   heating the chamber from room temperature to about 550° C. at a rate of about 20° C./min; and
   heating the chamber from about 550° C. to about 850° C. at a rate of about 5° C./min.

15. The method of claim 1, wherein the growth of the chalcogen-linked metallic film occurs by formation of nucleation sites on the edges of the pattern, wherein the nucleation sites merge to form the chalcogen-linked metallic film.

16. The method of claim 1, further comprising a step of cooling the chamber after heating the chamber.

17. The method of claim 16, wherein the chamber is cooled to room temperature over a period of one hour.

18. The method of claim 1, wherein the chamber is a furnace.

19. The method of claim 1, wherein the chamber is under a flow of an inert gas.

20. The method of claim 19, wherein the inert gas is selected from the group consisting of argon, nitrogen, helium, and combinations thereof.

21. The method of claim 20, wherein the inert gas comprises nitrogen.

22. The method of claim 1, further comprising a step of controlling a morphology of the chalcogen-linked metallic film, wherein the controlling comprises adjusting a growth parameter.

23. The method of claim 22, wherein the morphology comprises at least one of shape, size, or thickness.

24. The method of claim 22, wherein the growth parameter is selected from the group consisting of chalcogen source concentration, chamber pressure, metal source concentration, chamber temperature, type of surface, and combinations thereof.

25. The method of claim 1, wherein the chalcogen-linked metallic film comprises a single layer.

26. The method of claim 1, wherein the chalcogen-linked metallic film comprises multiple layers.

27. The method of claim 1, wherein the chalcogen-linked metallic film is a single-crystalline film.

28. The method of claim 1, wherein the chalcogen-linked metallic film is a sulfated metallic film.

29. The method of claim 1, wherein the chalcogen-linked metallic film is selected from the group consisting of $MoS_2$, $MoSe_2$, $MoS_1Se_1$, $WS_2$, $WSe_2$, $TiS_2$, and combinations thereof.

30. The method of claim 1, wherein the chalcogen-linked metallic film comprises $MoS_{2(1-x)}Se_{2x}$.

31. The method of claim 30, wherein x is at least one of 0.1, 0.3, 0.50 and 0.75.

32. The method of claim 1, wherein the chalcogen-linked metallic film is a transition metal dichalcogenide.

33. The method of claim 1, further comprising a step of transferring the chalcogen-linked metallic film to a new surface.

* * * * *